(12) United States Patent
Ryshtun et al.

(10) Patent No.: US 8,570,053 B1
(45) Date of Patent: Oct. 29, 2013

(54) CAPACITIVE FIELD SENSOR WITH SIGMA-DELTA MODULATOR

(75) Inventors: Andriy Ryshtun, Drogobych (UA); Victor Kremin, Lviv (UA)

(73) Assignee: Cypress Semiconductor Corporation, San Jose, CA (US)

(*) Notice: Subject to any disclaimer, the term of this patent is extended or adjusted under 35 U.S.C. 154(b) by 430 days.

(21) Appl. No.: 12/380,141

(22) Filed: Feb. 23, 2009

Related U.S. Application Data

(63) Continuation-in-part of application No. 12/167,100, filed on Jul. 2, 2008.

(60) Provisional application No. 60/947,865, filed on Jul. 3, 2007, provisional application No. 61/030,526, filed on Feb. 21, 2008.

(51) Int. Cl.
*G01R 27/26* (2006.01)

(52) U.S. Cl.
USPC .......................... 324/678; 324/681; 324/683

(58) Field of Classification Search
USPC ................................ 324/658, 678, 681, 683
See application file for complete search history.

(56) References Cited

U.S. PATENT DOCUMENTS

| | | | |
|---|---|---|---|
| 3,660,801 A | 5/1972 | Paulfus | |
| 3,921,167 A | 11/1975 | Fox | |
| 3,979,745 A | 9/1976 | Bishop | |
| 4,039,940 A | 8/1977 | Butler et al. | |
| 4,090,092 A | 5/1978 | Serrano | |
| 4,103,252 A | 7/1978 | Bobick | |
| 4,113,378 A | 9/1978 | Wirtz | |
| 4,145,748 A | 3/1979 | Eichelberger et al. | |
| 4,193,063 A | 3/1980 | Hitt et al. | |
| 4,238,711 A | 12/1980 | Wallot | |
| 4,264,903 A | 4/1981 | Bigelow | |
| 4,266,144 A | 5/1981 | Bristol | |
| 4,283,713 A | 8/1981 | Philipp | |
| 4,292,604 A | 9/1981 | Embree et al. | |
| 4,293,734 A | 10/1981 | Pepper, Jr. | |
| 4,305,135 A | 12/1981 | Dahl et al. | |
| 4,438,404 A | 3/1984 | Philipp | |
| 4,475,151 A | 10/1984 | Philipp | |
| 4,497,575 A | 2/1985 | Philipp | |

(Continued)

FOREIGN PATENT DOCUMENTS

| | | |
|---|---|---|
| EP | 0574213 A | 12/1993 |
| GB | 05000604 B2 | 2/2005 |

(Continued)

OTHER PUBLICATIONS

USPTO Non-Final Rejection for U.S. Appl. No. 11/442,212 dated Feb. 25, 2011; 13 pages.

(Continued)

*Primary Examiner* — Vincent Q Nguyen

(57) ABSTRACT

A capacitive sensor includes a switching capacitor circuit, a comparator, and a charge dissipation circuit. The switching capacitor circuit reciprocally couples a sensing capacitor in series with a modulation capacitor during a first switching phase and discharges the sensing capacitor during a second switching phase. The comparator is coupled to compare a voltage potential on the modulation capacitor to a reference and to generate a modulation signal in response. The charge dissipation circuit is coupled to the modulation capacitor to selectively discharge the modulation capacitor in response to the modulation signal.

20 Claims, 17 Drawing Sheets

(56) References Cited

U.S. PATENT DOCUMENTS

| | | |
|---|---|---|
| 4,558,274 A | 12/1985 | Carusillo |
| 4,586,260 A | 5/1986 | Baxter et al. |
| 4,614,937 A | 9/1986 | Poujois |
| 4,728,932 A | 3/1988 | Atherton |
| 4,736,097 A | 4/1988 | Philipp |
| 4,736,171 A | 4/1988 | Matzke et al. |
| 4,742,331 A | 5/1988 | Barrow et al. |
| 4,772,983 A | 9/1988 | Kerber et al. |
| 4,773,024 A | 9/1988 | Faggin et al. |
| 4,802,103 A | 1/1989 | Faggin et al. |
| 4,825,147 A | 4/1989 | Cook et al. |
| 4,831,325 A | 5/1989 | Watson, Jr. |
| 4,876,534 A | 10/1989 | Mead et al. |
| 4,878,013 A | 10/1989 | Andermo |
| 4,879,461 A | 11/1989 | Philipp |
| 4,879,505 A | 11/1989 | Barrow et al. |
| 4,879,508 A | 11/1989 | Andermo |
| 4,920,399 A | 4/1990 | Hall |
| 4,935,702 A | 6/1990 | Mead et al. |
| 4,940,980 A | 7/1990 | Tice |
| 4,953,928 A | 9/1990 | Anderson et al. |
| 4,962,342 A | 10/1990 | Mead et al. |
| 4,977,480 A | 12/1990 | Nishihara |
| 5,008,497 A | 4/1991 | Asher |
| 5,049,758 A | 9/1991 | Mead et al. |
| 5,055,827 A | 10/1991 | Philipp |
| 5,059,920 A | 10/1991 | Anderson et al. |
| 5,068,622 A | 11/1991 | Mead et al. |
| 5,073,759 A | 12/1991 | Mead et al. |
| 5,083,044 A | 1/1992 | Mead et al. |
| 5,095,284 A | 3/1992 | Mead |
| 5,097,305 A | 3/1992 | Mead et al. |
| 5,107,149 A | 4/1992 | Platt et al. |
| 5,109,261 A | 4/1992 | Mead et al. |
| 5,119,038 A | 6/1992 | Anderson et al. |
| 5,120,996 A | 6/1992 | Mead et al. |
| 5,122,800 A | 6/1992 | Philipp |
| 5,126,685 A | 6/1992 | Platt et al. |
| 5,146,106 A | 9/1992 | Anderson et al. |
| 5,160,899 A | 11/1992 | Anderson et al. |
| 5,165,054 A | 11/1992 | Platt et al. |
| 5,166,562 A | 11/1992 | Allen et al. |
| 5,204,549 A | 4/1993 | Platt et al. |
| 5,214,388 A | 5/1993 | Vranish et al. |
| 5,237,879 A | 8/1993 | Speeter |
| 5,243,554 A | 9/1993 | Allen et al. |
| 5,248,873 A | 9/1993 | Allen et al. |
| 5,260,592 A | 11/1993 | Mead et al. |
| 5,270,963 A | 12/1993 | Allen et al. |
| 5,276,407 A | 1/1994 | Mead et al. |
| 5,281,862 A | 1/1994 | Ma |
| 5,289,023 A | 2/1994 | Mead |
| 5,294,889 A | 3/1994 | Heep et al. |
| 5,303,329 A | 4/1994 | Mead et al. |
| 5,305,017 A | 4/1994 | Gerpheide |
| 5,323,158 A | 6/1994 | Ferguson, Jr. |
| 5,324,958 A | 6/1994 | Mead et al. |
| 5,331,215 A | 7/1994 | Allen et al. |
| 5,336,936 A | 8/1994 | Allen et al. |
| 5,339,213 A | 8/1994 | O'Callaghan |
| 5,349,303 A | 9/1994 | Gerpheide |
| 5,373,245 A | 12/1994 | Vranish et al. |
| 5,374,787 A | 12/1994 | Miller et al. |
| 5,381,515 A | 1/1995 | Platt et al. |
| 5,384,467 A | 1/1995 | Plimon et al. |
| 5,386,219 A | 1/1995 | Greanias et al. |
| 5,408,194 A | 4/1995 | Steinbach et al. |
| 5,412,387 A | 5/1995 | Vincelette et al. |
| 5,424,756 A | 6/1995 | Ho et al. |
| 5,461,321 A | 10/1995 | Sanders et al. |
| 5,479,103 A | 12/1995 | Kernahan et al. |
| 5,488,204 A | 1/1996 | Mead et al. |
| 5,495,077 A | 2/1996 | Miller et al. |
| 5,518,078 A | 5/1996 | Tsujioka et al. |
| 5,525,980 A | 6/1996 | Jahier et al. |
| 5,541,580 A | 7/1996 | Gerston et al. |
| 5,541,878 A | 7/1996 | Lemoncheck et al. |
| 5,543,588 A | 8/1996 | Bisset et al. |
| 5,543,590 A | 8/1996 | Gillespie et al. |
| 5,543,591 A | 8/1996 | Gillespie et al. |
| 5,555,907 A | 9/1996 | Philipp |
| 5,565,658 A | 10/1996 | Gerpheide et al. |
| 5,566,702 A | 10/1996 | Philipp |
| 5,572,205 A | 11/1996 | Caldwell et al. |
| 5,589,856 A | 12/1996 | Stein et al. |
| 5,629,891 A | 5/1997 | Lemoncheck et al. |
| 5,648,642 A | 7/1997 | Miller et al. |
| 5,670,915 A | 9/1997 | Cooper et al. |
| 5,672,959 A | 9/1997 | Der |
| 5,680,070 A | 10/1997 | Anderson et al. |
| 5,682,032 A | 10/1997 | Philipp |
| 5,684,487 A | 11/1997 | Timko |
| 5,694,063 A | 12/1997 | Burlison et al. |
| 5,730,165 A * | 3/1998 | Philipp .......................... 137/1 |
| 5,748,185 A | 5/1998 | Stephan et al. |
| 5,757,368 A | 5/1998 | Gerpheide et al. |
| 5,760,852 A | 6/1998 | Wu et al. |
| 5,763,909 A | 6/1998 | Mead et al. |
| 5,763,924 A | 6/1998 | Lum et al. |
| 5,767,457 A | 6/1998 | Gerpheide et al. |
| 5,796,183 A | 8/1998 | Hourmand |
| 5,801,340 A | 9/1998 | Peter |
| 5,812,698 A | 9/1998 | Platt et al. |
| 5,841,078 A | 11/1998 | Miller et al. |
| 5,844,265 A | 12/1998 | Mead et al. |
| 5,854,625 A | 12/1998 | Frisch et al. |
| 5,861,583 A | 1/1999 | Schediwy et al. |
| 5,861,875 A | 1/1999 | Gerpheide |
| 5,864,242 A | 1/1999 | Allen et al. |
| 5,864,392 A | 1/1999 | Winklhofer et al. |
| 5,880,411 A | 3/1999 | Gillespie et al. |
| 5,889,236 A | 3/1999 | Gillespie et al. |
| 5,905,489 A | 5/1999 | Takahama et al. |
| 5,914,465 A | 6/1999 | Allen et al. |
| 5,914,708 A | 6/1999 | LaGrange et al. |
| 5,920,309 A | 7/1999 | Bisset et al. |
| 5,920,310 A | 7/1999 | Faggin et al. |
| 5,926,566 A | 7/1999 | Wang et al. |
| 5,942,733 A | 8/1999 | Allen et al. |
| 5,943,052 A | 8/1999 | Allen et al. |
| 5,969,513 A | 10/1999 | Clark |
| 6,023,422 A | 2/2000 | Allen et al. |
| 6,028,271 A | 2/2000 | Gillespie et al. |
| 6,028,959 A | 2/2000 | Wang et al. |
| 6,037,929 A | 3/2000 | Ogura et al. |
| 6,037,930 A | 3/2000 | Wolfe et al. |
| 6,060,957 A | 5/2000 | Kodrnja et al. |
| 6,067,019 A | 5/2000 | Scott |
| 6,097,432 A | 8/2000 | Mead et al. |
| 6,145,850 A | 11/2000 | Rehm |
| 6,148,104 A | 11/2000 | Wang et al. |
| 6,184,871 B1 | 2/2001 | Teres et al. |
| 6,185,450 B1 | 2/2001 | Seguine et al. |
| 6,188,228 B1 | 2/2001 | Philipp |
| 6,188,391 B1 | 2/2001 | Seely et al. |
| 6,191,723 B1 | 2/2001 | Lewis |
| 6,222,528 B1 | 4/2001 | Gerpheide et al. |
| 6,239,389 B1 | 5/2001 | Allen et al. |
| 6,249,447 B1 | 6/2001 | Boylan et al. |
| 6,262,717 B1 | 7/2001 | Donohue et al. |
| 6,271,719 B1 | 8/2001 | Sevastopoulos |
| 6,271,720 B1 | 8/2001 | Sevastopoulos |
| 6,271,835 B1 | 8/2001 | Hoeksma |
| 6,278,283 B1 | 8/2001 | Tsugai |
| 6,280,391 B1 | 8/2001 | Olson et al. |
| 6,288,707 B1 | 9/2001 | Philipp |
| 6,295,052 B1 | 9/2001 | Kato et al. |
| 6,304,014 B1 | 10/2001 | England et al. |
| 6,320,184 B1 | 11/2001 | Winklhofer et al. |
| 6,323,846 B1 | 11/2001 | Westerman et al. |
| 6,326,859 B1 | 12/2001 | Goldman et al. |
| 6,342,817 B1 | 1/2002 | Crofts et al. |
| 6,344,773 B1 | 2/2002 | Sevastopoulos et al. |
| 6,353,200 B1 | 3/2002 | Schwankhart |

(56) References Cited

U.S. PATENT DOCUMENTS

| | | | |
|---|---|---|---|
| 6,366,099 B1 | 4/2002 | Reddi |
| 6,377,009 B1 | 4/2002 | Philipp |
| 6,377,129 B1 | 4/2002 | Rhee et al. |
| 6,380,929 B1 | 4/2002 | Platt |
| 6,380,931 B1 | 4/2002 | Gillespie et al. |
| 6,400,217 B1 | 6/2002 | Bhandari |
| 6,414,671 B1 | 7/2002 | Gillespie et al. |
| 6,424,338 B1 | 7/2002 | Anderson |
| 6,430,305 B1 | 8/2002 | Decker |
| 6,441,073 B1 | 8/2002 | Tanaka et al. |
| 6,441,682 B1 | 8/2002 | Vinn et al. |
| 6,445,257 B1 | 9/2002 | Cox et al. |
| 6,448,911 B1 | 9/2002 | Somayajula |
| 6,452,514 B1 | 9/2002 | Philipp |
| 6,457,355 B1 | 10/2002 | Philipp |
| 6,459,321 B1 | 10/2002 | Belch |
| 6,466,036 B1 | 10/2002 | Philipp |
| 6,473,069 B1 | 10/2002 | Gerpheide |
| 6,489,899 B1 | 12/2002 | Ely et al. |
| 6,490,203 B1 | 12/2002 | Tang |
| 6,498,720 B2 | 12/2002 | Glad |
| 6,499,359 B1 | 12/2002 | Washeleski et al. |
| 6,522,083 B1 | 2/2003 | Roach |
| 6,522,128 B1 | 2/2003 | Ely et al. |
| 6,522,187 B1 | 2/2003 | Sousa |
| 6,523,416 B2 | 2/2003 | Takagi et al. |
| 6,529,015 B2 | 3/2003 | Nonoyama et al. |
| 6,534,970 B1 | 3/2003 | Ely et al. |
| 6,535,200 B2 | 3/2003 | Philipp |
| 6,570,557 B1 | 5/2003 | Westerman et al. |
| 6,574,095 B2 | 6/2003 | Suzuki |
| 6,577,140 B1 | 6/2003 | Wenman |
| 6,583,632 B2 | 6/2003 | Von Basse et al. |
| 6,587,093 B1 | 7/2003 | Shaw et al. |
| 6,597,347 B1 | 7/2003 | Yasutake |
| 6,610,936 B2 | 8/2003 | Gillespie et al. |
| 6,614,313 B2 | 9/2003 | Crofts et al. |
| 6,624,640 B2 | 9/2003 | Lund et al. |
| 6,639,586 B2 | 10/2003 | Gerpheide |
| 6,642,857 B1 | 11/2003 | Schediwy et al. |
| 6,649,924 B1 | 11/2003 | Philipp et al. |
| 6,667,740 B2 | 12/2003 | Ely et al. |
| 6,673,308 B2 | 1/2004 | Hino et al. |
| 6,677,758 B2 | 1/2004 | Maki et al. |
| 6,677,932 B1 | 1/2004 | Westerman |
| 6,680,731 B2 | 1/2004 | Gerpheide et al. |
| 6,683,462 B2 | 1/2004 | Shimizu |
| 6,690,066 B1 | 2/2004 | Lin et al. |
| 6,704,005 B2 | 3/2004 | Kato et al. |
| 6,705,511 B1 | 3/2004 | Dames et al. |
| 6,714,817 B2 | 3/2004 | Daynes et al. |
| 6,720,777 B2 | 4/2004 | Wang |
| 6,730,863 B1 | 5/2004 | Gerpheide et al. |
| 6,731,121 B1 | 5/2004 | Hsu et al. |
| 6,744,258 B2 | 6/2004 | Ishio et al. |
| 6,750,852 B2 | 6/2004 | Gillespie et al. |
| 6,768,420 B2 | 7/2004 | McCarthy et al. |
| 6,774,644 B2 | 8/2004 | Eberlein |
| 6,781,577 B2 | 8/2004 | Shigetaka |
| 6,788,221 B1 | 9/2004 | Ely et al. |
| 6,788,521 B2 | 9/2004 | Nishi |
| 6,798,218 B2 | 9/2004 | Kasperkovitz |
| 6,806,693 B1 | 10/2004 | Bron |
| 6,809,275 B1 | 10/2004 | Cheng et al. |
| 6,810,442 B1 | 10/2004 | Lin et al. |
| 6,825,673 B1 | 11/2004 | Yamaoka |
| 6,825,890 B2 | 11/2004 | Matsufusa |
| 6,829,727 B1 | 12/2004 | Pawloski |
| 6,838,887 B2 | 1/2005 | Denen et al. |
| 6,856,433 B2 | 2/2005 | Hatano et al. |
| 6,859,159 B2 | 2/2005 | Michalski |
| 6,861,961 B2 | 3/2005 | Sandbach et al. |
| 6,873,203 B1 | 3/2005 | Latham, II et al. |
| 6,879,215 B1 | 4/2005 | Roach |
| 6,882,338 B2 | 4/2005 | Flowers |
| 6,888,536 B2 | 5/2005 | Westerman et al. |
| 6,888,538 B2 | 5/2005 | Ely et al. |
| 6,891,531 B2 | 5/2005 | Lin |
| 6,893,724 B2 | 5/2005 | Lin et al. |
| 6,897,673 B2 | 5/2005 | Savage et al. |
| 6,903,402 B2 | 6/2005 | Miyazawa |
| 6,904,570 B2 | 6/2005 | Foote et al. |
| 6,914,547 B1 | 7/2005 | Swaroop et al. |
| 6,933,873 B1 | 8/2005 | Horsley et al. |
| 6,940,291 B1 | 9/2005 | Ozick |
| 6,946,853 B2 | 9/2005 | Gifford et al. |
| 6,949,811 B2 | 9/2005 | Miyazawa |
| 6,949,937 B2 | 9/2005 | Knoedgen |
| 6,958,594 B2 | 10/2005 | Redl et al. |
| 6,969,978 B2 | 11/2005 | Dening |
| 6,970,120 B1 | 11/2005 | Bjornsen |
| 6,970,126 B1 | 11/2005 | O'Dowd et al. |
| 6,975,123 B1 | 12/2005 | Malang et al. |
| 6,993,607 B2 | 1/2006 | Philipp |
| 6,999,009 B2 | 2/2006 | Monney |
| 7,002,557 B2 | 2/2006 | Iizuka et al. |
| 7,006,078 B2 | 2/2006 | Kim |
| 7,006,938 B2 | 2/2006 | Laraia et al. |
| 7,030,782 B2 | 4/2006 | Ely et al. |
| 7,030,860 B1 | 4/2006 | Hsu et al. |
| 7,031,886 B1 | 4/2006 | Hargreaves |
| 7,032,051 B2 | 4/2006 | Reay et al. |
| 7,046,230 B2 | 5/2006 | Zadesky et al. |
| 7,068,039 B2 | 6/2006 | Parker |
| 7,075,316 B2 | 7/2006 | Umeda et al. |
| 7,075,864 B2 | 7/2006 | Kakitsuka et al. |
| 7,078,916 B2 | 7/2006 | Denison |
| 7,098,675 B2 | 8/2006 | Inaba et al. |
| 7,109,978 B2 | 9/2006 | Gillespie et al. |
| 7,119,550 B2 | 10/2006 | Kitano et al. |
| 7,129,714 B2 | 10/2006 | Baxter |
| 7,129,935 B2 | 10/2006 | Mackey |
| 7,133,140 B2 | 11/2006 | Lukacs et al. |
| 7,133,793 B2 | 11/2006 | Ely et al. |
| 7,141,968 B2 | 11/2006 | Hibbs et al. |
| 7,141,987 B2 | 11/2006 | Hibbs et al. |
| 7,148,704 B2 | 12/2006 | Philipp |
| 7,151,276 B2 | 12/2006 | Gerlach et al. |
| 7,151,528 B2 | 12/2006 | Taylor et al. |
| 7,158,056 B2 | 1/2007 | Wright et al. |
| 7,158,125 B2 | 1/2007 | Sinclair et al. |
| 7,202,655 B2 | 4/2007 | Itoh |
| 7,202,857 B2 | 4/2007 | Hinckley et al. |
| 7,205,777 B2 | 4/2007 | Schulz et al. |
| 7,212,189 B2 | 5/2007 | Shaw et al |
| 7,224,591 B2 | 5/2007 | Kaishita et al. |
| 7,225,090 B2 | 5/2007 | Coley |
| 7,233,508 B2 | 6/2007 | Itoh |
| 7,235,983 B2 | 6/2007 | O'Dowd et al. |
| 7,245,131 B2 | 7/2007 | Kurachi et al. |
| 7,253,643 B1 | 8/2007 | Seguine |
| 7,254,775 B2 | 8/2007 | Geaghan et al. |
| 7,256,588 B2 | 8/2007 | Howard et al. |
| 7,262,609 B2 | 8/2007 | Reynolds |
| 7,271,608 B1 | 9/2007 | Vermeire et al. |
| 7,288,946 B2 | 10/2007 | Hargreaves et al. |
| 7,288,977 B2 | 10/2007 | Stanley |
| 7,298,124 B2 | 11/2007 | Kan et al. |
| 7,301,350 B2 | 11/2007 | Hargreaves et al. |
| 7,307,485 B1 | 12/2007 | Snyder et al. |
| 7,312,616 B2 | 12/2007 | Snyder |
| 7,323,879 B2 | 1/2008 | Kuo et al. |
| 7,323,886 B2 | 1/2008 | Lee |
| 7,333,090 B2 | 2/2008 | Tanaka et al. |
| 7,339,580 B2 | 3/2008 | Westerman et al. |
| 7,359,816 B2 | 4/2008 | Kumar et al. |
| 7,375,535 B2 | 5/2008 | Kutz et al. |
| 7,381,031 B2 | 6/2008 | Kawaguchi et al. |
| 7,392,431 B2 | 6/2008 | Swoboda |
| 7,417,411 B2 | 8/2008 | Hoffman et al. |
| 7,417,441 B2 | 8/2008 | Reynolds |
| 7,423,437 B2 | 9/2008 | Hargreaves et al. |
| 7,439,962 B2 | 10/2008 | Reynolds et al. |
| 7,449,895 B2 | 11/2008 | Ely et al. |

(56) References Cited

U.S. PATENT DOCUMENTS

| | | |
|---|---|---|
| 7,450,113 B2 | 11/2008 | Gillespie et al. |
| 7,451,050 B2 | 11/2008 | Hargreaves |
| 7,453,270 B2 | 11/2008 | Hargreaves et al. |
| 7,453,279 B2 | 11/2008 | Corbin, Jr. et al. |
| 7,466,307 B2 | 12/2008 | Trent, Jr. et al. |
| 7,479,788 B2 | 1/2009 | Bolender et al. |
| 7,495,659 B2 | 2/2009 | Marriott et al. |
| 7,499,040 B2 | 3/2009 | Zadesky et al. |
| 7,504,833 B1 | 3/2009 | Seguine |
| 7,515,140 B2 | 4/2009 | Philipp |
| 7,521,941 B2 | 4/2009 | Ely et al. |
| RE40,867 E | 8/2009 | Binstead |
| 7,598,822 B2 | 10/2009 | Rajagopal et al. |
| 7,667,468 B1 | 2/2010 | Anderson |
| 7,683,641 B2 | 3/2010 | Hargreaves et al. |
| 7,804,307 B1 | 9/2010 | Bokma et al. |
| 7,812,829 B2 | 10/2010 | Gillespie et al. |
| 7,821,274 B2 | 10/2010 | Philipp et al. |
| 7,911,456 B2 | 3/2011 | Gillespie et al. |
| 7,932,897 B2 | 4/2011 | Elias et al. |
| 8,040,142 B1 | 10/2011 | Bokma et al. |
| 8,068,097 B2 | 11/2011 | Guanghai |
| 8,082,566 B2 | 12/2011 | Stallings |
| 8,089,288 B1 | 1/2012 | Maharita |
| 8,089,289 B1 | 1/2012 | Kremin et al. |
| 8,093,914 B2 | 1/2012 | Maharyta et al. |
| 8,144,126 B2 | 3/2012 | Wright |
| 8,169,238 B1 | 5/2012 | Maharyta et al. |
| 2001/0012667 A1 | 8/2001 | Ma et al. |
| 2002/0000978 A1 | 1/2002 | Gerpheide |
| 2002/0063688 A1 | 5/2002 | Shaw et al. |
| 2002/0067348 A1 | 6/2002 | Masters et al. |
| 2002/0109035 A1 | 8/2002 | Denen et al. |
| 2002/0136372 A1 | 9/2002 | Bozorgui-Nesbat |
| 2002/0140440 A1 | 10/2002 | Haase |
| 2002/0191029 A1 | 12/2002 | Gillespie et al. |
| 2003/0014239 A1 | 1/2003 | Ichbiah et al. |
| 2003/0025679 A1 | 2/2003 | Taylor et al. |
| 2003/0062889 A1 | 4/2003 | Ely et al. |
| 2003/0063073 A1 | 4/2003 | Geaghan et al. |
| 2003/0063428 A1 | 4/2003 | Nishi |
| 2003/0076306 A1 | 4/2003 | Zadesky et al. |
| 2003/0080755 A1 | 5/2003 | Kobayashi |
| 2003/0091220 A1 | 5/2003 | Sato et al. |
| 2003/0098858 A1 | 5/2003 | Perski et al. |
| 2003/0156098 A1 | 8/2003 | Shaw et al. |
| 2003/0160808 A1 | 8/2003 | Foote et al. |
| 2003/0178675 A1 | 9/2003 | Nishizaka et al. |
| 2003/0183864 A1 | 10/2003 | Miyazawa |
| 2003/0183884 A1 | 10/2003 | Miyazawa |
| 2003/0184315 A1 | 10/2003 | Eberlein |
| 2003/0189419 A1 | 10/2003 | Maki et al. |
| 2003/0230438 A1 | 12/2003 | Keefer et al. |
| 2003/0232507 A1 | 12/2003 | Chen |
| 2004/0041798 A1 | 3/2004 | Kim |
| 2004/0068409 A1 | 4/2004 | Tanaka et al. |
| 2004/0082198 A1 | 4/2004 | Nakamura et al. |
| 2004/0169594 A1 | 9/2004 | Ely et al. |
| 2004/0178989 A1 | 9/2004 | Shahoian et al. |
| 2004/0178997 A1 | 9/2004 | Gillespie et al. |
| 2004/0183560 A1 | 9/2004 | Savage et al. |
| 2004/0217945 A1 | 11/2004 | Miyamoto et al. |
| 2004/0239616 A1 | 12/2004 | Collins |
| 2004/0239650 A1 | 12/2004 | Mackey |
| 2004/0252109 A1 | 12/2004 | Trent et al. |
| 2004/0263864 A1 | 12/2004 | Lukacs et al. |
| 2005/0021269 A1 | 1/2005 | Ely et al. |
| 2005/0024341 A1 | 2/2005 | Gillespie et al. |
| 2005/0031175 A1 | 2/2005 | Hara et al. |
| 2005/0062732 A1 | 3/2005 | Sinclair et al. |
| 2005/0073302 A1 | 4/2005 | Hibbs et al. |
| 2005/0073322 A1 | 4/2005 | Hibbs et al. |
| 2005/0083110 A1 | 4/2005 | Latham, II et al. |
| 2005/0099188 A1 | 5/2005 | Baxter |
| 2005/0159126 A1 | 7/2005 | Wang |
| 2005/0169768 A1 | 8/2005 | Kawaguchi et al. |
| 2005/0179668 A1 | 8/2005 | Edwards |
| 2005/0270273 A1 | 12/2005 | Marten |
| 2005/0275382 A1 | 12/2005 | Stessman et al. |
| 2005/0280639 A1 | 12/2005 | Taylor et al. |
| 2005/0283330 A1 | 12/2005 | Laraia et al. |
| 2006/0022660 A1 | 2/2006 | Itoh |
| 2006/0026535 A1 | 2/2006 | Hotelling et al. |
| 2006/0032680 A1 | 2/2006 | Elias et al. |
| 2006/0033508 A1 | 2/2006 | Lee |
| 2006/0033724 A1 | 2/2006 | Chaudhri et al. |
| 2006/0038793 A1 | 2/2006 | Philipp |
| 2006/0049834 A1 | 3/2006 | Umeda |
| 2006/0053387 A1 | 3/2006 | Ording |
| 2006/0066582 A1 | 3/2006 | Lyon et al. |
| 2006/0066585 A1 | 3/2006 | Lin |
| 2006/0097991 A1 | 5/2006 | Hotelling et al. |
| 2006/0097992 A1 | 5/2006 | Gitzinger et al. |
| 2006/0108349 A1 | 5/2006 | Finley et al. |
| 2006/0113974 A1 | 6/2006 | Kan et al. |
| 2006/0114247 A1 | 6/2006 | Brown |
| 2006/0139469 A1 | 6/2006 | Yokota et al. |
| 2006/0152739 A1 | 7/2006 | Silvestre |
| 2006/0164142 A1 | 7/2006 | Stanley |
| 2006/0172767 A1 | 8/2006 | Cathey et al. |
| 2006/0176718 A1 | 8/2006 | Itoh |
| 2006/0187214 A1 | 8/2006 | Gillespie et al. |
| 2006/0193156 A1 | 8/2006 | Kaishita et al. |
| 2006/0197750 A1 | 9/2006 | Kerr et al. |
| 2006/0197752 A1 | 9/2006 | Hurst et al. |
| 2006/0227117 A1 | 10/2006 | Proctor |
| 2006/0232559 A1 | 10/2006 | Chien et al. |
| 2006/0258390 A1 | 11/2006 | Cui et al. |
| 2006/0262101 A1 | 11/2006 | Layton et al. |
| 2006/0267953 A1 | 11/2006 | Peterson et al. |
| 2006/0273804 A1 | 12/2006 | Delorme et al. |
| 2006/0290678 A1 | 12/2006 | Lii |
| 2007/0046299 A1 | 3/2007 | Hargreaves et al. |
| 2007/0069274 A1 | 3/2007 | Elsass et al. |
| 2007/0074913 A1 | 4/2007 | Geaghan et al. |
| 2007/0076897 A1 | 4/2007 | Philipp |
| 2007/0100566 A1 | 5/2007 | Coley |
| 2007/0132737 A1 | 6/2007 | Mulligan et al. |
| 2007/0152983 A1 | 7/2007 | McKillop et al. |
| 2007/0164756 A1 | 7/2007 | Lee |
| 2007/0173220 A1 | 7/2007 | Kim et al. |
| 2007/0176609 A1 | 8/2007 | Ely et al. |
| 2007/0176903 A1 | 8/2007 | Dahlin et al. |
| 2007/0229469 A1 | 10/2007 | Seguine |
| 2007/0236478 A1 | 10/2007 | Geaghan et al. |
| 2007/0257894 A1 | 11/2007 | Philipp |
| 2007/0263191 A1 | 11/2007 | Shibazaki |
| 2007/0268243 A1 | 11/2007 | Choo et al. |
| 2007/0268265 A1 | 11/2007 | Xiaoping |
| 2007/0268273 A1 | 11/2007 | Westerman et al. |
| 2007/0268274 A1 | 11/2007 | Westerman et al. |
| 2007/0268275 A1 | 11/2007 | Westerman et al. |
| 2007/0273659 A1 | 11/2007 | Xiaoping et al. |
| 2007/0291013 A1 | 12/2007 | Won |
| 2007/0296709 A1 | 12/2007 | Guanghai |
| 2008/0007529 A1 | 1/2008 | Paun et al. |
| 2008/0007534 A1 | 1/2008 | Peng et al. |
| 2008/0024455 A1 | 1/2008 | Lee et al. |
| 2008/0036473 A1 | 2/2008 | Jansson |
| 2008/0041639 A1 | 2/2008 | Westerman et al. |
| 2008/0041640 A1 | 2/2008 | Gillespie et al. |
| 2008/0042986 A1 | 2/2008 | Westerman et al. |
| 2008/0042987 A1 | 2/2008 | Westerman et al. |
| 2008/0042988 A1 | 2/2008 | Westerman et al. |
| 2008/0042989 A1 | 2/2008 | Westerman et al. |
| 2008/0042994 A1 | 2/2008 | Gillespie et al. |
| 2008/0047764 A1 | 2/2008 | Lee et al. |
| 2008/0048997 A1 | 2/2008 | Gillespie et al. |
| 2008/0062140 A1 | 3/2008 | Hotelling et al. |
| 2008/0068100 A1 | 3/2008 | Goodnow et al. |
| 2008/0088595 A1 | 4/2008 | Liu et al. |
| 2008/0111714 A1* | 5/2008 | Kremin .................. 341/33 |
| 2008/0116904 A1 | 5/2008 | Reynolds et al. |
| 2008/0128182 A1 | 6/2008 | Westerman et al. |

(56) References Cited

U.S. PATENT DOCUMENTS

| | | |
|---|---|---|
| 2008/0158178 A1 | 7/2008 | Hotelling et al. |
| 2008/0165134 A1 | 7/2008 | Krah |
| 2008/0179112 A1 | 7/2008 | Qin et al. |
| 2008/0196945 A1 | 8/2008 | Konstas |
| 2008/0266263 A1 | 10/2008 | Motaparti et al. |
| 2008/0278178 A1 | 11/2008 | Philipp |
| 2009/0002206 A1 | 1/2009 | Kremin |
| 2009/0096758 A1 | 4/2009 | Hotelling et al. |
| 2009/0153152 A1 | 6/2009 | Maharyta et al. |
| 2009/0322351 A1 | 12/2009 | Mcleod |
| 2012/0043973 A1 | 2/2012 | Kremin |

FOREIGN PATENT DOCUMENTS

| | | |
|---|---|---|
| JP | 412528 | 1/1992 |
| JP | 5283519 | 10/1993 |
| JP | 6104334 | 4/1994 |
| JP | 6163528 | 6/1994 |
| WO | 0002188 A | 1/2000 |

OTHER PUBLICATIONS

U.S. Appl. No. 11/600,255, "Capacitance to Code Converter With Sigma-Delta Modulator," Kremin, filed Nov. 14, 2006; 102 pages.
U.S. Appl. No. 13/049,798: "Capacitance to Code Converter with Sigma-Delta Modulator," Kremin, filed Mar. 16, 2011; 77 pages.
USPTO Notice of Allowance for U.S. Appl. No. 12/167,100 dated Sep. 1, 2011; 8 pages.
USPTO Notice of Allowance for U.S. Appl. No. 12/167,100 dated Jun. 28, 2011; 8 pages.
USPTO Notice of Allowance for U.S. Appl. No. 12/167,100 dated Apr. 29, 2011; 8 pages.
USPTO Notice of Allowance for U.S Appl. No. 12/167,100 dated Jan. 12, 2011; 8 pages.
USPTO Notice of Allowance for U.S. Appl. No. 12/167,100 dated Sep. 30, 2010; 7 pages.
USPTO Requirement for Restriction for U.S. Appl. No. 12/167,100 dated Aug. 20, 2010; 6 pages.
USPTO Requirement for Restriction for U.S. Appl. No. 11/600,255 dated Jun. 16, 2011; 7 pages.
USPTO Requirement for Restriction for U.S. Appl. No. 11/600,255 dated Apr. 20, 2011; 7 pages.
USPTO Notice of Allowance for U.S. Appl. No. 11/600,255 dated Dec. 9, 2010; 6 pages.
USPTO Requirement for Restriction for U.S. Appl. No. 11/600,255 dated Jul. 27, 2010; 6 pages.
USPTO Non-Final Rejection for U.S. Appl. No. 11/600,255 dated Mar. 29, 2010; 10 pages.
U.S. Appl. No. 13/191,806 "Capacitance Measurement Systems and Methods", filed Jul. 27, 2011, 38 pages.
U.S. Appl. No. 13/342,942 "Capacitive Field Sensor with Sigma-Delta Modulator", filed Jan. 3, 2012, 41 pages.
U.S. Appl. No. 11/824,249 "Noise Resistant Capacitive Sensor", filed Jun. 29, 2007, 34 pages.
U.S. Appl. No. 13/345,504 "Compensation Circuit for a TX-RX Capacitive Sensor", filed Jan. 6, 2012, 55 pages.
USPTO Notice of Allowance, U.S. Appl. No. 11/601,465, dated Oct. 7, 2011, 19 pages.
USPTO Notice of Allowance, U.S. Appl. No. 11/601,465, dated Jun. 28, 2011, 21 pages.
USPTO Notice of Allowance, U.S. Appl. No. 11/729,818, dated May 9, 2011, 22 pages.
USPTO Notice of Allowance, U.S. Appl. No. 11/729,818, dated Feb. 24, 2010, 33 pages.
USPTO Notice of Allowance, U.S. Appl. No. 11/729,818, dated Jun. 25, 2010, 39 pages.
USPTO Notice of Allowance, U.S. Appl. No. 11/729,818, dated Oct. 5, 2010, 33 pages.
USPTO Notice of Allowance, U.S. Appl. No. 11/729,818, Jan. 26, 2011, 12 pages.
USPTO Notice of Allowance, U.S. Appl. No. 11/729,818, dated Jun. 9, 2011, 13 pages.
USPTO Notice of Allowance, U.S. Appl. No. 11/729,818, dated Dec. 17, 2008, 37 pages.
USPTO Notice of Allowance, U.S. Appl. No. 11/729,818, dated Jul. 2, 2009, 30 pages.
USPTO Notice of Allowance, U.S. Appl. No. 11/729,818, dated Nov. 13, 2009, 29 pages.
USPTO Notice of Allowance, U.S. Appl. No. 13/047,320, dated Feb. 27, 2012, 7 pages.
USPTO Notice of Allowance, U.S. Appl. No. 13/047,620, dated Apr. 11, 2012, 19 pages.
USPTO Notice of Allowance, U.S. Appl. No. 11/824,249, dated Feb. 17, 2011, 6 pages.
USPTO Non-Final Rejection, U.S. Appl. No. 11/824,249, dated May 25, 2011, 12 pages.
USPTO Non-Final Rejection, U.S. Appl. No. 11/824,249, dated Dec. 22, 2011, 12 pages.
USPTO Non-Final Rejection, U.S. Appl. No. 11/824,249, dated Mar. 30, 2012, 14 pages.
USPTO Final Rejection, U.S. Appl. No. 12/861,815, dated Oct. 18, 2011, 16 pages.
USPTO Non-Final Rejection, U.S. Appl. No. 11/823,982, dated Mar. 19, 2009, 21 pages.
USPTO Notice of Allowance, U.S. Appl. No. 11/823,982, dated Oct. 6, 2009, 22 pages.
USPTO Non-Final Rejection, U.S. Appl. No. 11/823,982, dated Feb. 1, 2010, 30 pages.
USPTO Notice of Allowance, U.S. Appl. No. 11/823,982, dated May 14, 2010, 32 pages.
U.S. Appl. No. 12/861,812 "Capacitance Measurement Systems and Methods", filed Aug. 23, 2010, 24 pages.
U.S. Appl. No. 13/047,620 "Touch Detection Techniques for Capacitive Touch Sense Systems", filed Mar. 14 2011, 38 pages.
USPTO Notice of Allowance, U.S. Appl. No. 11/600,255, dated Apr. 12, 2011, 15 pages.
USPTO Notice of Allowance, U.S. Appl. No. 11/601,465, dated Mar. 11, 2011, 17 pages.
USPTO Non-Final Rejection, U.S. Appl. No. 12/332,980, dated Dec. 22, 2010, 20 pages.
USPTO Final Rejection, U.S. Appl. No. 12/332,980, dated May 31, 2011, 12 pages.
USPTO Advisory Action, U.S. Appl. No. 12/332,980, dated Aug. 9, 2011, 4 pages.
USPTO Notice of Allowance, U.S. Appl. No. 12/332,980, dated Oct. 4, 2011, 13 pages.
USPTO Restriction Requirement, U.S. Appl. No. 11/601,465, dated Nov. 1, 2007, 7 pages.
USPTO Non-Final Rejection, U.S. Appl. No. 11/601,465, dated Dec. 28, 2007, 16 pages.
USPTO Final Rejection, U.S. Appl. No. 11/601,465, dated Jul. 9, 2008, 16 pages.
USPTO Non-Final Rejection, U.S. Appl. No. 11/601,465, dated Oct. 2, 2008, 16 pages.
USPTO Final Rejection, U.S. Appl. No. 11/601,465, dated Mar. 6, 2009, 13 pages.
USPTO Notice of Allowance, U.S. Appl. No. 11/601,465, dated May 8, 2009, 14 pages.
USPTO Notice of Allowance, U.S. Appl. No. 11/601,465, dated Sep. 10, 2009, 21 pages.
USPTO Notice of Allowance, U.S. Appl. No. 11/601,465, dated Jan. 11, 2010, 18 pages.
USPTO Notice of Allowance, U.S. Appl. No. 11/601,465, dated Apr. 22, 2010, 41 pages.
USPTO Notice of Allowance, U.S. Appl. No. 11/601,465, dated Aug. 10, 2010, 17 pages.
USPTO Notice of Allowance, U.S. Appl. No. 11/601,465, dated Nov. 26, 2010, 16 pages.
USPTO Non-Final Rejection for U.S. Appl. No. 11/502,267 dated Aug. 11, 2008; 10 pages.
USPTO Non-Final Rejection for U.S. Appl. No. 11/600,896 dated May 14, 2010; 15 pages.

(56) References Cited

OTHER PUBLICATIONS

USPTO Non-Final Rejection for U.S. Appl. No. 11/600,896 dated Dec. 16, 2009; 13 pages.
USPTO Non-Final Rejection for U.S. Appl. No. 11/700,314 dated Mar. 26, 2010; 7 pages.
USPTO Non-Final Rejection for U.S. Appl. No. 11/709,897 dated Feb. 16, 2010; 21 pages.
USPTO Non-Final Rejection for U.S. Appl. No. 11/823,982 dated Mar. 19, 2009; 14 pages.
USPTO Non-Final Rejection for U.S. Appl. No. 11/824,249 dated May 25, 2011; 9 pages.
USPTO Non-Final Rejection for U.S. Appl. No. 11/880,963 dated Jun. 12, 2009; 10 pages.
USPTO Non-Final Rejection for U.S. Appl. No. 11/967,243, dated Sep. 17, 2009; 9 pages.
USPTO Non-Final Rejection for U.S. Appl. No. 11/983,291 dated Mar. 9, 2009; 9 pages.
USPTO Non-Final Rejecton for U.S. Appl. No. 12/040,387 dated Jun. 30, 2011; 12 pages.
Written Opion of the International Searching Authority for International Application No. PCT/US08/60696 dated Sep. 22, 2008; 4 pages.
Wikipedia, The Free Encyclopedia, "IDM PC Keyboard," <http://en.wikipedia.org/wiki/PC_keyboard> accessed May 19, 2006; 3 pages.
USPTO Non-Final Rejection for U.S. Appl. No. 12/239,692 dated Nov. 29, 2010; 9 pages.
USPTO Non-Final Rejection for U.S. Appl. No. 12/367,279 dated Oct. 29, 2009; 8 pages.
USPTO Non-Final Rejection for U.S. Appl. No. 12/395,462 dated Aug. 23, 2011; 5 pages.
USPTO Non-Final Rejection for U.S. Appl. No. 12/606,147 dated Aug. 23, 2011; 6 pages.
Van Ess, David; "Simulating a 555 Timer with PSoC," Cypress Semiconductor Corporatiom, Application Note AN2286, May 19, 2005; 10 pages.
USPTO Non-Final Rejection, U.S. Appl. No. 11/512,042, dated Jul. 13, 2010, 14 pages.
USPTO Notice of Allowance for U.S. Appl. No. 09/975,105 dated Dec. 4, 2006; 4 pages.
USPTO Notice of Allowance for U.S. Appl. No. 09/986,338 dated Feb. 16, 2010; 4 pages.
USPTO Notie of Allowance for U.S. Appl. No. 10/888,666 dated Aug. 2, 2006; 11 pages.
USPTO Notice of Allowance for U.S. Appl. No. 11/230,719 dated Jan. 16, 2008; 4 pages.
USPTO Notice of Allowance for U.S. Appl. No. 11/273,708 dated Aug. 9, 2007; 4 pages.
USPTO Notice of Allowance for U.S. Appl. No. 11/337,272 dated Aug. 15, 2007; 9 pages.
USPTO Notice of Allowance for U.S. Appl. No. 11/395,417 dated Nov. 6, 2008; 7 pages.
USPTO Notice of Allowance for U.S. Appl. No. 11/484,085 dated Jun. 10, 2010; 4 pages.
USPTO Notice of Allowance for U.S. Appl. No. 11/489,944 dated Apr. 9, 2007; 7 pages.
USPTO Requirement Restriction for U.S. Appl. No. 11/824,249 dated Feb. 17, 2011; 5 pages.
USPTO Requirement for Restriction/Election for U.S. Appl. No. 11/337,272 dated Sep. 11, 2006; 5 pages.
USPTO Notice of Allowance for U.S. Appl. No. 11/700,314 dated Sep. 16, 2010; 8 pages.
USPTO Notice of Allowance for U.S. Appl. No. 11/709,866 dated Feb. 16, 2010; 7 pages.
USPTO Notice of Allowance for U.S. Appl. No. 11/823,982 dated Feb. 1, 2010; 8 pages.
USPTO Notice of Allowance for U.S. Appl. No. 11/823,982 dated Oct. 6, 2009; 12 pages.
USPTO Notice of Allowance for U.S. Appl. No. 11/880,963 dated Oct. 2, 2009; 4 pages.
USPTO Notice of Allowance for U.S. Appl. No. 11/983,291 dated Mar. 9, 2010; 7 pages.
USPTO Notice of Allowance for U.S. Appl. No. 11/983,291 dated Jun. 21, 2010; 7 pages.
USPTO Requirement for Restricton for U.S. Appl. No. 12/395,462 dated May 13, 2011; 6 pages.
USPTO Notice of Allowance for U.S. Appl. No. 11/983,291 dated Oct. 22, 2009; 7 pages.
USPTO Notice of Allowance for U.S. Appl. No. 12/166,228 dated Mar. 22, 2011; 8 pages.
USPTO Notice of Allowance for U.S. Appl. No. 12/367,279 dated Aug. 23, 2010; 7 pages.
USPTO Requirement for Restriction for U.S. Appl. No. 12/239,692 dated Sep. 27, 2010; 7 pages.
USPTO Requirement for Restriction for U.S. Appl. No. 12/380,141 dated Jul. 8, 2011; 6 pages.
Written Opinion of the International Searching Authority for International Application No. PCT/US2008/013622 mailed Feb. 9, 2009; 5 pages.
"CSD User Module Data Sheet,"0 CSD v1.0, Oct. 23, 2006; 58 pages.
"Sigma-Delta ADCs and DACs, AN-283 Application Note, Analog Devices," 1993; Downloaded from <http://www.analog.com/UpoloadedFiles/Application_Notes/292524291525717245054923680458171AN283.pdf>; 16 pages.
"The Virtual Keyboard: I-Tech Bluetooth/Serial Virtual Laser Keyboard Available Now!" The Virtual Laser Keyboard (VKB) Online Worldwide Shop, <http://www.virtual-laser-keyboard.com>, downloaded Apr. 13, 2006; 4 pages.
Andrew S. Tanebaum with contributions from James R. Goodman, "Structured Computer Organization", 1999, Prentice Hall, Fourth Edition, pp. 264-288, 359-362.
U.S. Appl. No. 13/049,798: "Capacitance to Code Converter with Sigman-Delta Modulator," Kremin, filed Mar. 16, 2011; 77 pages.
U.S. Appl. No. 11/493,350: "Technique for Increasing the Sensitivity of Capacitive Sensor Arrays," Lee et al., filed Jul. 25, 2006; 48 pages.
U.S. Appl. No. 11/709,897: "Preventing Unintentional Activation of a Sensor Element of a Sensing Device," Jason Konstas; filed Feb. 21, 2007; 97 pages.
U.S. Appl. No. 12/197,466: "Redical Oxidation Process for Fabricating a Nonvolatile Charge Trap Memory Device," Ramkumar et al., filed Aug. 25, 2008; 68 pages.
U.S. Appl. No. 12/380,141: "Capacitive field sensor with sigma-delta modulator," Rystun et al., filed Feb. 23, 2009; 48 pages.
U.S. Appl. No. 12/618,661: "Automatic Tuning of a Capacitive Sensing Device," Dana Olson, filed Nov. 13, 2009; 30 pages.
U.S. Appl. No. 60/220,921: "Method for Automatically Tuning a Capacitive Sensing Device," Dana Olson, filed Jun. 26, 2009; 13 pages.
Chapweske, Adam, "The PS/2 Mouse Interface," PS/2 Mouse Interfacing, 2001, retrieved May 18, 2006; 11 pages.
Cypress Semiconductor Corp., "PSoC Mixed Signal Controllers", Product Descriptioin, http://www.cypress.com/portal/server.pt?space=CommunityPage . . . , Sept. 27, 2005, pp. 1-2.
Cypress Semiconductor Corporation, "CY8C21x34 Data Sheet," CSR User Module, CSR V.1.0; Oct. 6, 2005; 36 pages.
Cypress Semiconductor Corporation, "Cypress Introduces PSoC(TM)-Based Capacitive Touch Sensor Solution," Cypress Press Release; May 31, 2005; <http://www.cypress.com/portal/server>; retrieved on Feb. 5, 2007; 4 pages.
Cypress Semiconductor Corporatiom, "FAN Controller CG6457AM and CG6462AM," PSoC Mixed Signal Array Preliminary Sheet; May 24, 2005; 25 pages.
Cypress Semiconductor Corporation, "PSoC CY8C20x34 Technical Reference Manual (TRM)," PSoC CY8C20x34 TRM, Version 1.0, 2006; 220 pages.
Cypress Semiconductor Corporation, "PSoC Mixed-Signal Controllers," Production Description; <http://www.cypress.com/portal/server>; retrieved on Sep. 27, 2005; 2 pages.
Cypress Semiconductor Corporation, "Release Notes sm017," Jan. 24, 2007; 3 pages.
Dave Van Ess, "Understanding Switched Capacitor Analog Blocks," Application Note AN2041, Mar. 30, 2004; 16 pages.

(56) References Cited

OTHER PUBLICATIONS

Dennis Seguine, "Capacitive Key Scan," Application Note, AN2233, Revision A, Cypress Microsystems, http://www.cypress.com/, http://www.cypress.com/support/mysupport.cfm, Oct. 15, 2004, pp. 1-7.
Dennis Seguine, "Capacitive Switch Scan," AN2233a, Application Note, CY8c21X34, Apr. 7, 2005; 6 pages.
Dennis Seguine, "Capacitive Switch Scan," Cypress Semiconductor Application Note, Apr. 14, 2005; 6 pages.
Golub, V., "Sigma-delta ADCs", Publication date Jun. 17, 2003, 10 pages.
International Search Report and Written Opinion of the International Searching Authority for International Application No. PCT/US08/06627 (PM07024WO), filed on May 23, 2008 and mailed Aug. 26, 2008.
International Search Report and Written Opinion of the International Searching Authority for International Application No. PCT/US08/06627 (PM07024WO), filed May 23, 2008 and mailed Aug. 26, 2008.
International Search Report for International Application No. PCT/US05/23468 dated Aug. 25, 2006; 2 pages.
International Search Report of the International Authority for International Application No. PCT/US2008/013622, mailed Feb. 9, 2009; 2pages.
International Search Report of the International Searching Authority, dated Feb. 9, 2009 for International Application No. PCTUS2008/013622; 2 pages.
International Written Opinion of the International Searching Authority, dated Feb. 9, 2009 for International Application No. PCTUS2008/013622; 5 pages.
USPTO Advisory Action for U.S. Appl. No. 11/437,517 dated Apr. 7, 2010; 3 pages.
Kremin, V. "Noise resistant capacitive sensor," US Patent Application Serial No. 11/8244249 filed Jun. 29, 2007.
Larry K. Baxter, "Capacitive Sensors, Design and Applications," IEEE Press, The Institute of Electrical and Electronics Engineers Inc., Aug. 1996, pp. 177-187; 12 pages.
Lee, Mark; "EMC Design Considerations for PSoC CapSense Applications," Cypress Semiconductor Corporation, Application Note AN2318; Sep. 16, 2005; 6 pages.
Mack, Chris, "Semiconductor Lithography—The Basic Process", Gentleman Scientist, downloaded Apr. 20, 2006, 12 pages, http://lithoguru.com/scientist/lithobasics.html.
Mark Lee, "CapSense Best Practice", Cypress Application Note AN2394, Rev., Oct. 19, 2006, pp. 1-10.
Milton Ohring, "The Materials Science of Thin Films: Deposition and Structure," 2nd Edition, Academic Press, 2002, pp. 336-337; 4 pages.
Min et al., "Offset Compensation of Capacitive Sensors for Electrostatic Microactuators," ISIE 2001, IEEE, Pusan Korea, pp. 2114-2117; 4 pages.
Ryan Seguine et al, "Layout Guidelines for PSoC CapSense", Cypress Application Note AN2292, Revision B, Oct. 31, 2005, pp. 1-15.
Sangil Park, "Motorola Digital Signal Processors, Principles of Sigma-Delta Modulation for Analog-to-Digital Converters," Rev. 1, downloaded from <http://digitalsignallabs.com/SigmaDelta.pdf>, Mar. 1997; 64 pages.
Sedra, Adel S. et al., "Microelectronic Circuits," 3rd Edition, Oxford University Press, pp. xiii-xx and 861-883, 1991; 20 pages.
Seguine, Ryan; "Layout Guidelines for PSoC CapSense," Cypress Semiconductor Corporation, Application Note AN2292; Jul. 22, 2005; 13 pages.
USPTO Advisory Action for U.S. Appl. No. 11/442,212 dated Jan. 5, 2011; 3 pages.
The Authoritative Dictionary of IEEE Standards Terms, 2000, IEEE Press Publications, 7th Edition, pp. 1133-1134; 4 pages.
The Written Opinion of the International Searching Authority for International Application No. PCT/US05/23468 dated Aug. 25, 2006; 7 pages.
USPTO Advisory Action for U.S. Appl. No. 11/230,719 dated Nov. 3, 2007; 3 pages.
USPTO Advisory Action for U.S. Appl. No. 11/337,272 dated Apr. 3, 2007; 3 pages.
USPTO Advisory Action for U.S. Appl. No. 11/395,417 dated Jul. 6, 2007; 3 pages.
Janusz Mlodzianowski, "A Simple Multipurpose Logic Analyzer," Dec. 1997, Circuit Cellar Ink, Issue 89, pp. 28-36.
Ted Tsui, "Migrating from CSR to CSD," Cypress Semiconductor Corporation, Application Note AN2408, Feb. 8, 2007, http://www.cypress.com.
USPTO Final Rejection for U.S. Appl. No. 12/166,228 dated May 28, 2010; 12 pages.
USPTO Final Rejection, U.S. Appl. No. 11/512,042, dated Dec. 21, 2010, 7 pages.
USPTO Non-Final Rejection for U.S. Appl. No. 12/166,228 dated Aug. 11, 2010; 8 pages.
USPTO Non-Final Rejection for U.S. Appl. No. 12/166,228 dated Dec. 30, 2009; 11 pages.
USPTO Non-Final Rejection for U.S. Appl. No. 12/861,812 dated Apr. 15, 2011; 26 pages.
USPTO Notice of Allowance for U.S. Appl. No. 11/489,944 dated May 24, 2007; 2 pages.
Vladislav Golub, Ph.D., "Sigma-Delta ADCs", pub. date: Jun. 17, 2003, 10 pages.
USPTO Notice of Allowance for U.S. Appl. No. 11/983,291 dated Sep. 29, 2010; 7 pages.
USPTO Advisory Action for U.S. Appl. No. 11/442,212 dated Dec. 17, 2009; 3 pages.
USPTO Advisory Action for U.S. Appl. No. 11/477,179 dated Jun. 7, 2010; 3 pages.
USPTO Advisory Action for U.S. Appl. No. 11/512,042 dated Feb. 23, 2011; 3 pages.
USPTO Advisory Action for U.S. Appl. No. 12/367,279 dated Jun. 25, 2010; 3 pages.
USPTO Final Rejection for U.S. Appl. No. 09/975,105 dated Jul. 13, 2006; 7 pages.
USPTO Final Rejection for U.S. Appl. No. 11/230,719 dated Sep. 7, 2007; 9 pages.
USPTO Final Rejection for U.S. Appl. No. 11/273,708 dated Jul. 5, 2007; 8 pages.
USPTO Final Rejection for U.S. Appl. No. 11/337,272 dated Feb. 2, 2004; 11 pages.
USPTO Final Rejection for U.S. Appl. No. 11/395,417 dated Apr. 24, 2007; 9 pages.
UPTO Final Rejection for U.S. Appl. No. 11/437,517 dated Jan. 26, 2010; 11 pages.
USPTO Final Rejection for U.S. Appl. No. 11/442,212 dated Jun. 7, 2011; 14 pages.
USPTO Final Rejection for U.S. Appl. No. 11/442,212 dated Oct. 2, 2009; 12 pages.
USPTO Final Rejection for U.S. Appl. No. 11/442,212 dated Oct. 13, 2010; 13 pages.
USPTO Final Rejection for U.S. Appl. No. 11/477,179 dated Apr. 1, 2010; 10 pages.
USPTO Final Rejection for U.S. Appl. No. 11/477,179 dated Nov. 24, 2010; 10 pages.
USPTO Final Rejection for U.S. Appl. No. 11/484,085 dated Mar. 16, 2010; 7 pages.
USPTO Final Rejection for U.S. Appl. No. 11/502,267 dated Feb. 3, 2009; 10 pages.
USPTO Final Rejection for U.S. Appl. No. 11/512,042 dated Dec. 21, 2010; 7 pages.
USPTO Final Rejection for U.S. Appl. No. 11/600,896 dated Sep. 30, 2010; 19 pages.
USPTO Final Rejection for U.S. Appl. No. 11/601,465 dated May 28, 2010; 12 pages.
USPTO Final Rejection for U.S. Appl. No. 11/709,897 dated Jul. 29, 2010; 24 pages.
USPTO Final Rejection for U.S. Appl. No. 11/983,291 dated Aug. 12, 2009; 10 pages.
USPTO Final Rejection for U.S. Appl. No. 12/166,228 dated Jan. 4, 2011; 9 pages.
USPTO Non-Final Rejection for U.S. Appl. No. 11/484,085 dated Sep. 17, 2009; 8 pages.

(56) References Cited

OTHER PUBLICATIONS

USPTO Final Rejection for U.S. Appl. No. 12/239,692 dated May 9, 2011; 10 pages.
USPTO Final Rejection for U.S. Appl. No. 12/367,279 dated Apr. 1, 2010; 6 pages.
USPTO Non-Final Rejection for U.S. Appl. No. 11/493,350 dated Jun. 16, 2010; 8 pages.
USPTO Non-Final Rejection for U.S. Appl. No. 09/975,105 dated Jan. 19, 2006; 5 pages.
USPTO Non-Final Rejection for U.S. Appl. No. 09/975,105 dated Apr. 19, 2005; 9 pages.
USPTO Non-Final Rejection for U.S. Appl. No. 11/230,719 dated Jan. 16, 2007; 8 pages.
USPTO Non-Final Rejection for U.S. Appl. No. 11/230,719 dated May 11, 2006; 5 pages.
USPTO Non-Final Rejection for U.S. Appl. No. 11/230,719 dated May 25, 2007; 6 pages.
USPTO Non-Final Rejection for U.S. Appl. No. 11/230,719 dated Aug. 28, 2006; 7 pages.
USPTO Non-Final Rejection for U.S. Appl. No. 11/273,708 dated Mar. 19, 2007; 16 pages.
USPTO Non-Final Rejection for U.S. Appl. No. 11/337,272 dated May 17, 2007; 11 pages.
USPTO Non-Final Rejection for U.S. Appl. No. 11/337,272 dated Oct. 24, 2006; 9 pages.
USPTO Non-Final Rejection for U.S. Appl. No. 11/395,417 dated Apr. 25, 2008; 7 pages.
USPTO Non-Final Rejection for U.S. Appl. No. 11/395,417 dated Nov. 26, 2006; 13 pages.
USPTO Non-Final Rejection for U.S. Appl. No. 11/395,417 dated Nov. 1, 2007; 8 pages.
USPTO Non-Final Rejection for U.S. Appl. No. 11/437,517 dated Aug. 3, 2010; 10 pages.
USPTO Non-Final Rejection for U.S. Appl. No. 11/437,517 dated Aug. 5, 2009; 9 pages.
USPTO Non-Final Rejection for U.S. Appl. No. 11/442,212 dated Mar. 31, 2009; 12 pages.
USPTO Non-Final Rejection for U.S. Appl. No. 11/442,212 dated Jul. 6, 2010; 13 pages.
USPTO Non-Final Rejection for U.S. Appl. No. 11/493,350 dated Nov. 9, 2010; 9 pages.
USPTO Non-Final Rejection for U.S. Appl. No. 11/477,179 dated Jun. 9, 2009; 13 pages.
USPTO Non-Final Rejection for U.S. Appl. No. 11/477,179 dated Jul. 20, 2010; 10 pages.
USPTO Non-Final Rejection for U.S. Appl. No. 11/477,179 dated Nov. 18, 2009; 10 pages.
U.S. Appl. No. 12/167,100 "Capacitive Field Sensor With Sigma-Delta Modulator" Victor Kremin et al., filed Jul. 2, 2008; 39 pages.
USPTO Notice of Allowance for U.S. Appl. No. 11/600,255 dated May 30, 2012.
U.S. Appl. No. 60/947,865: "Capactivie Field Sensor with Sigma-Delta Modulator," Viktor Kremin, filed Jul. 3, 2007; 33 pages.
U.S. Appl. No. 61/016,123: "Capacitive Field Sensor With Sigma-Delta Modulator" filed Dec. 21, 2007, 23 pages.
U.S. Appl. No. 61/030,526: "Capacitive Sensing Universal System and Method," Andriy Ryshtun, filed Feb. 21, 2008; 22 pages.
USPTO Final Rejection for U.S. Appl. No. 12/395,969 dated Jul. 17, 2012; 25 pages.
USPTO Notice of Allowance for U.S. Appl. No. 13/612,803 date Dec. 10, 2012; 8 pages.
USPTO Non-Final Rejection for U.S. Appl. No. 13/612,803 dated Feb. 5, 2013; 7 pages.
USPTO Notice of Allowance for U.S. Appl. No. 13/612,803 dated May 2, 2013; 8 pages.

\* cited by examiner

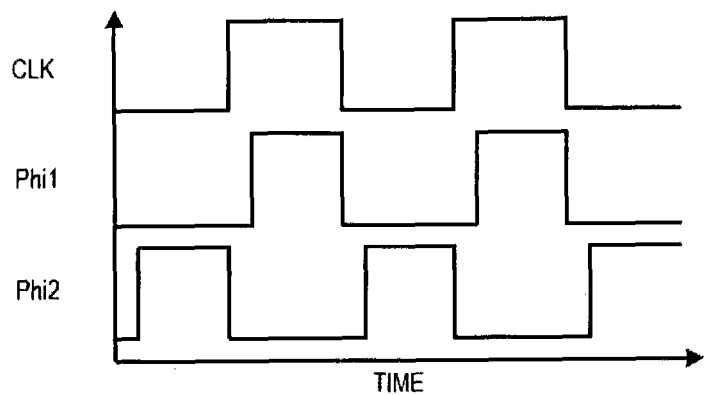
FIG. 4A
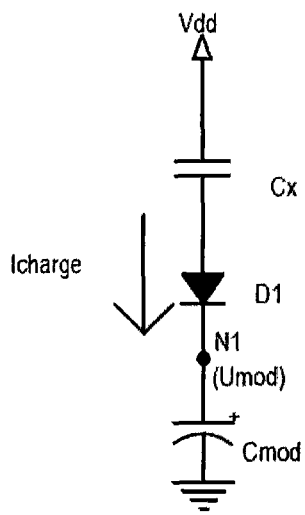
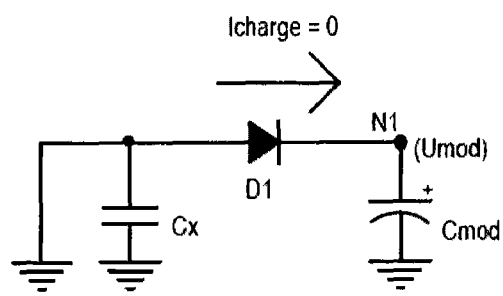
FIG. 4B

1080

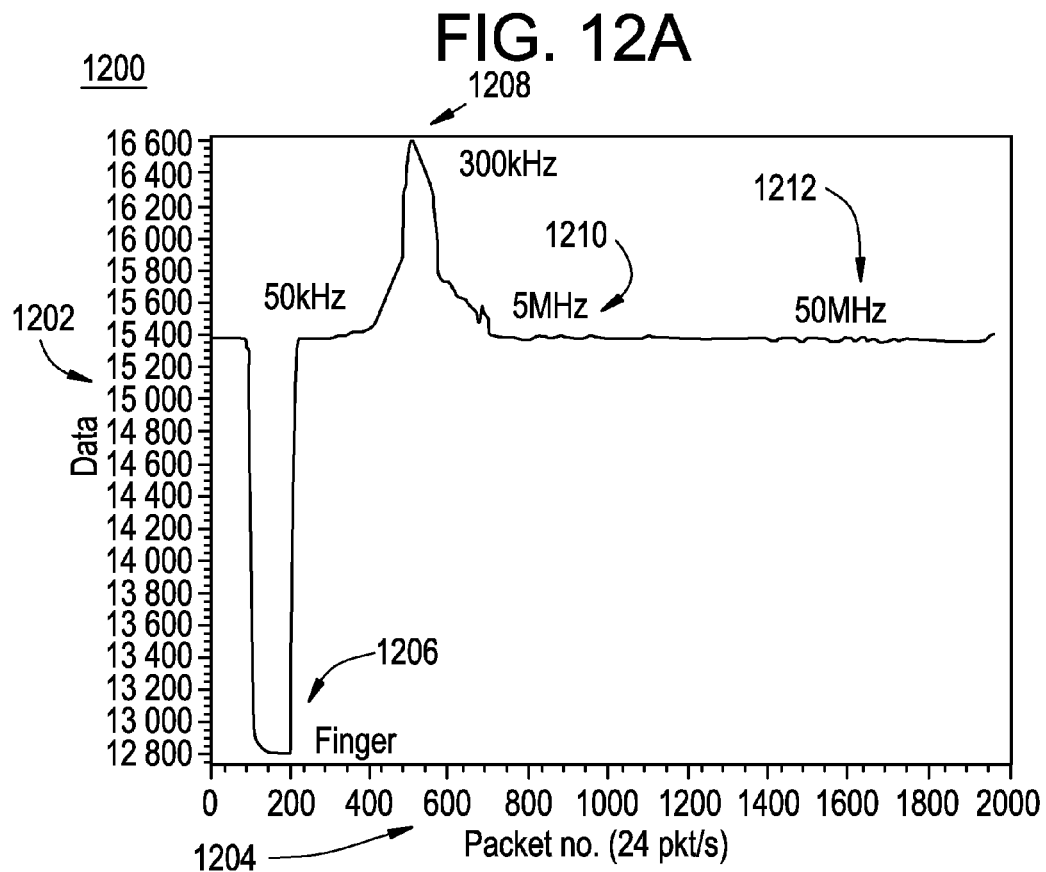
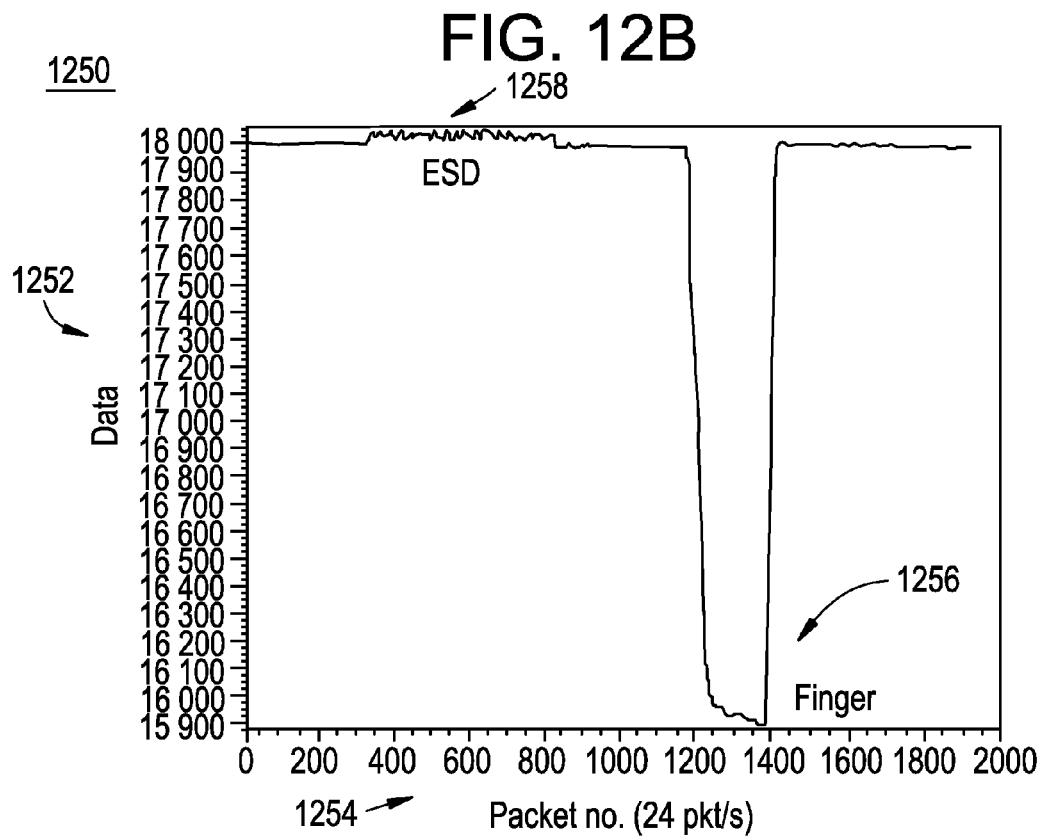

1300

CAPACITIVE FIELD SENSOR WITH SIGMA-DELTA MODULATOR

CROSS REFERENCE TO RELATED APPLICATIONS

This Continuation-In-Part Application claims the benefit and priority to the co-pending, commonly-owned application Ser. No. 12/167,100, filed on Jul. 2, 2008, by Kremin et al., and titled "Capacitive Field Sensor With Sigma-Delta Modulator," which claims the benefit of U.S. Provisional Application No. 60/947,865, filed on Jul. 3, 2007, by Kremin et al. and titled "Capacitive Field Sensor With Sigma-Delta Modulator," which are incorporated herein by reference.

This application claims the benefit of U.S. Provisional Application with Application No. 61/030,526, filed on Feb. 21, 2008, by Andriy Ryshtun, and titled "Capacitive Sensing Universal Method (CSU)", the contents of which are incorporated herein by reference.

TECHNICAL FIELD

This disclosure relates generally to electronic circuits, and in particular but not exclusively, relates to capacitance sensing circuits.

BACKGROUND INFORMATION

Capacitance sensors are used to implement a variety of useful functions including touch sensors (e.g., touch pad, touch dial, touch wheel, etc.), determining the presence of an object, accelerometers, and other functions. In general, capacitive sensors are intended to replace mechanical buttons, knobs, and other similar mechanical user interface controls. A capacitive sensor permits eliminating complicated mechanical switches and buttons, providing reliable operation under harsh conditions. Capacitive sensors are widely used in the modern consumer applications, providing new user interface options in the exiting products (cell phones, digital music players, personal digital assistances, etc.).

One class of capacitive sensor uses a charge transfer technique. Referring to FIG. 1A, the charge transfer technique charges a sensing capacitor Cx in one phase (switch SW1 closed, switch SW2 open) and discharges the sensing capacitor Cx into a summing capacitor Csum in a second phase (SW1 open, SW2 closed). Switches SW1 and SW2 are operated in a non-overlapping manner repeating the transfer of charge from Cx to Csum.

Capacitance sensor 100 is operated to measure the capacitance of Cx in the following manner. In an initial stage, Csum is reset by discharging Csum by temporarily closing switch SW3. Then, switches SW1 and SW2 commence operating in the two non-overlapping phases that charge Cx and transfer the charge from Cx into Csum. The voltage potential on Csum rises with each charge transfer phase, as illustrated in FIG. 1B. The voltage on Csum can by calculated according to equation 1.

$$V_{Csum} = V_{dd}(1 - e^{-N\frac{Cx}{Csum}}) \quad \text{(Equation 1)}$$

where $V_{Csum}$ represents the voltage on Csum, N represents the cycle count, Cx and Csum represent capacitance values, and Vdd represents a power supply voltage. Accordingly, the capacitance of Cx can be determined by measuring the number of cycles (or time) required to raise Csum to a predetermined voltage potential.

The charge transfer method is advantageous due to its relative low sensitivity to RF fields and RF noise. This relative noise immunity stems from the fact that the sensing capacitor Cx is typically charged by a low-impedance source and the charge is transferred to a low-impedance accumulator (i.e., the summing capacitor Csum). However, conventional capacitance sensors have the disadvantage that that voltage on the summing capacitor Csum rises versus time/cycles in an exponential manner (see FIG. 1B and Equation 1). The exponential relationship between the accumulated voltage potential on Csum and the charge transfer time/cycles requires some linearization if the capacitance of Cx is calculated as a function of the voltage potential on Csum after a predetermined time or number of cycles.

BRIEF DESCRIPTION OF THE DRAWINGS

Non-limiting and non-exhaustive embodiments of the invention are described with reference to the following figures, wherein like reference numerals refer to like parts throughout the various views unless otherwise specified.

FIG. 4A is a timing diagram illustrating non-overlapping clock signals, in accordance with an embodiment of the invention.

FIG. 4B includes two phase diagrams illustrating operation of a switching capacitor circuit, in accordance with an embodiment of the invention.

FIGS. 12A-B are graphs of exemplary signals of an exemplary capacitive sensing system, in accordance with an embodiment of the invention.

DETAILED DESCRIPTION

Embodiments of an apparatus and method for a capacitive sensor with a sigma-delta modulator are described herein. In the following description numerous specific details are set forth to provide a thorough understanding of the embodiments. One skilled in the relevant art will recognize, however, that the techniques described herein can be practiced without one or more of the specific details, or with other methods, components, materials, etc. In other instances, well-known structures, materials, or operations are not shown or described in detail to avoid obscuring certain aspects.

Reference throughout this specification to "one embodiment" or "an embodiment" means that a particular feature, structure, or characteristic described in connection with the embodiment is included in at least one embodiment of the present invention. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments.

Figure 1A:
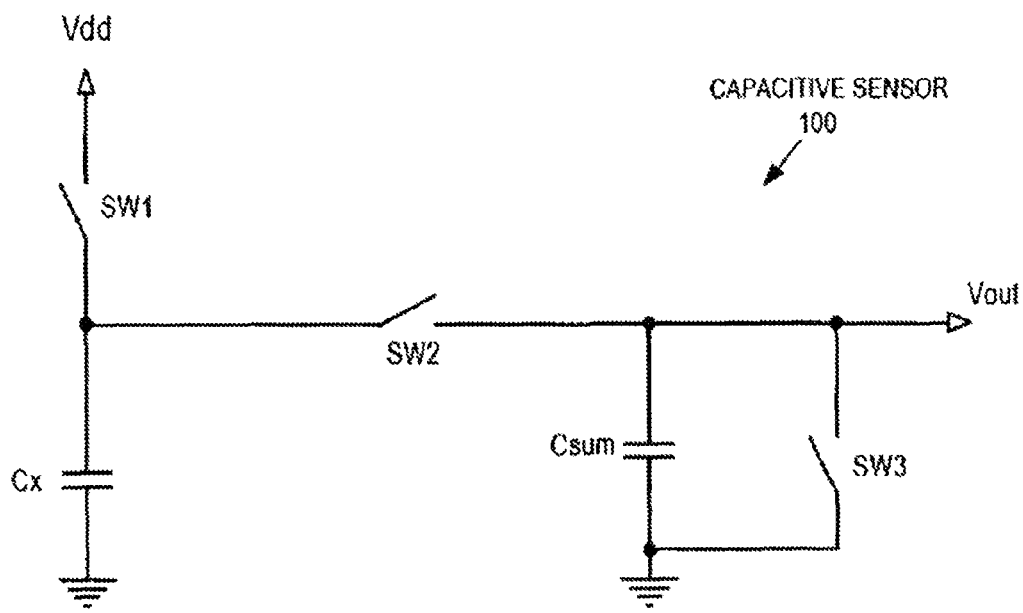
FIG. 1A is a circuit diagram illustrating a conventional capacitance sensor circuit.
Figure 1B:
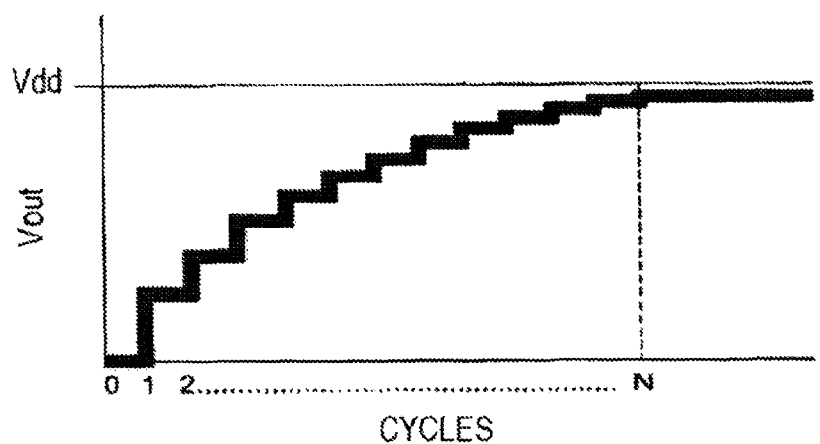
FIG. 1B is a graph illustrating the exponential relationship between voltage on a summing capacitor and charge transfer cycles.
Figure 2:
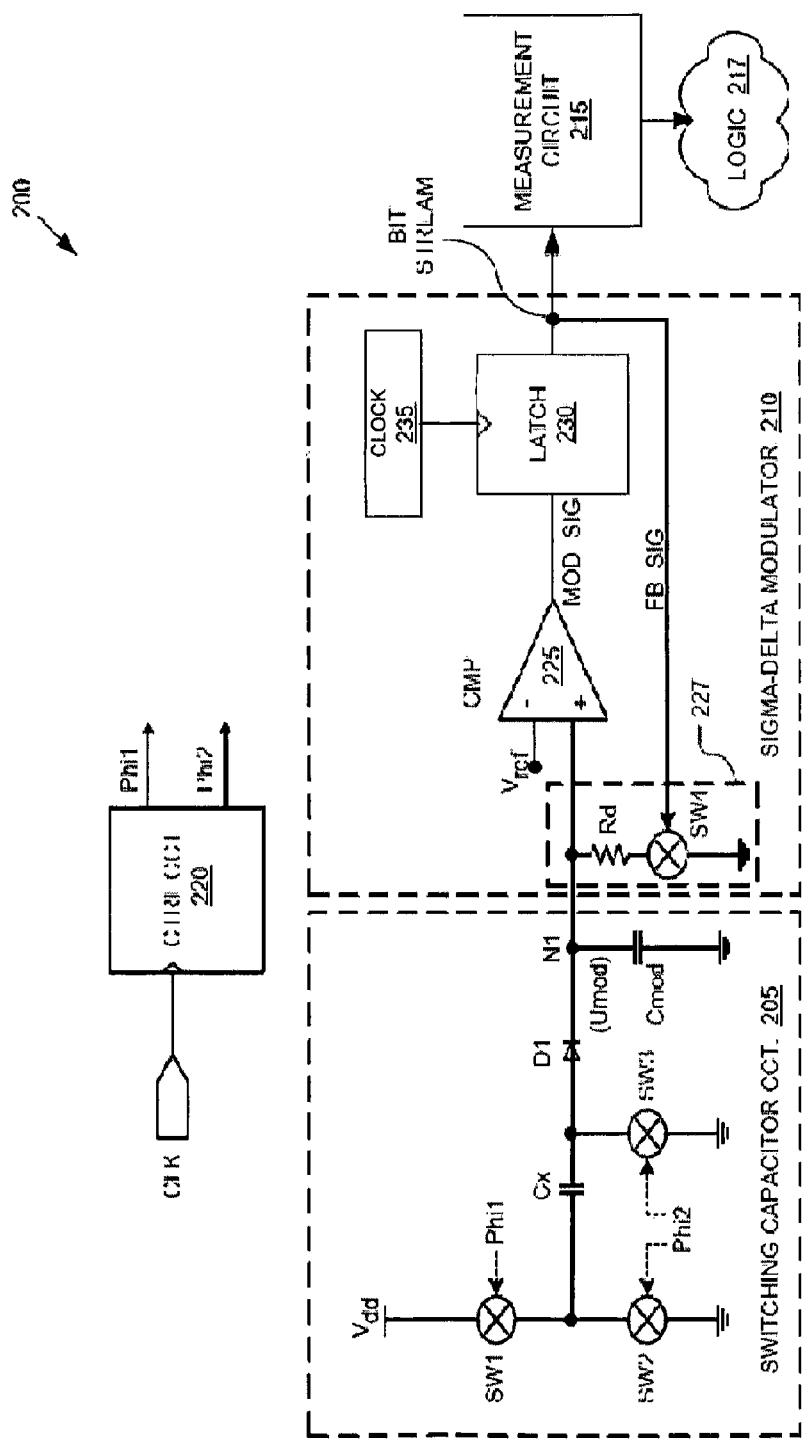
FIG. 2 is circuit diagram of a capacitive sensor with a sigma-delta modulator, in accordance with an embodiment of the invention.

FIG. 2 is a circuit diagram illustrating a capacitive sensor 200, in accordance with an embodiment of the invention. Capacitive sensor 200 is capable of converting the measurement of the capacitance of sensing capacitor (Cx) into the measurement of the duty cycle of a feedback pulse signal (FB_SIG). Furthermore, the relationship between the duty cycle of FB_SIG and the capacitance of Cx is substantially linear. Capacitive sensor 200 may also be regarded as a switching capacitor current to duty cycle converter.

The illustrated embodiment of capacitance sensor 200 includes a switching capacitor circuit 205, sigma-delta modulator 210, a measurement circuit 215, logic 217, and a control circuit 220. The illustrated embodiment of switching capacitor circuit 205 includes sensing capacitor (Cx), switches SW1, SW2, and SW3, a diode D1, and a modulation capacitor (Cmod). The illustrated embodiment of sigma-delta modulator 210 includes a comparator (CMP) 225, a latch 230, a clock source 235, a discharge resistor (Rd), and a discharge switch SW4. Collectively, the discharge resistor Rd and discharge switch SW4 may be referred to as a charge dissipation circuit 227. While component values of switching capacitor circuit 205 and sigma-delta modulator 210 may vary based on the particular application, in general, the capacitance of Cmod will be substantially larger than the capacitance of Cx. Since Cmod acts to accumulate charge transferred from Cx over multiple cycles, it is often referred to as a summing capacitor or an integrating capacitor. In one embodiment, comparator 225 is an analog voltage comparator.

Figure 3:
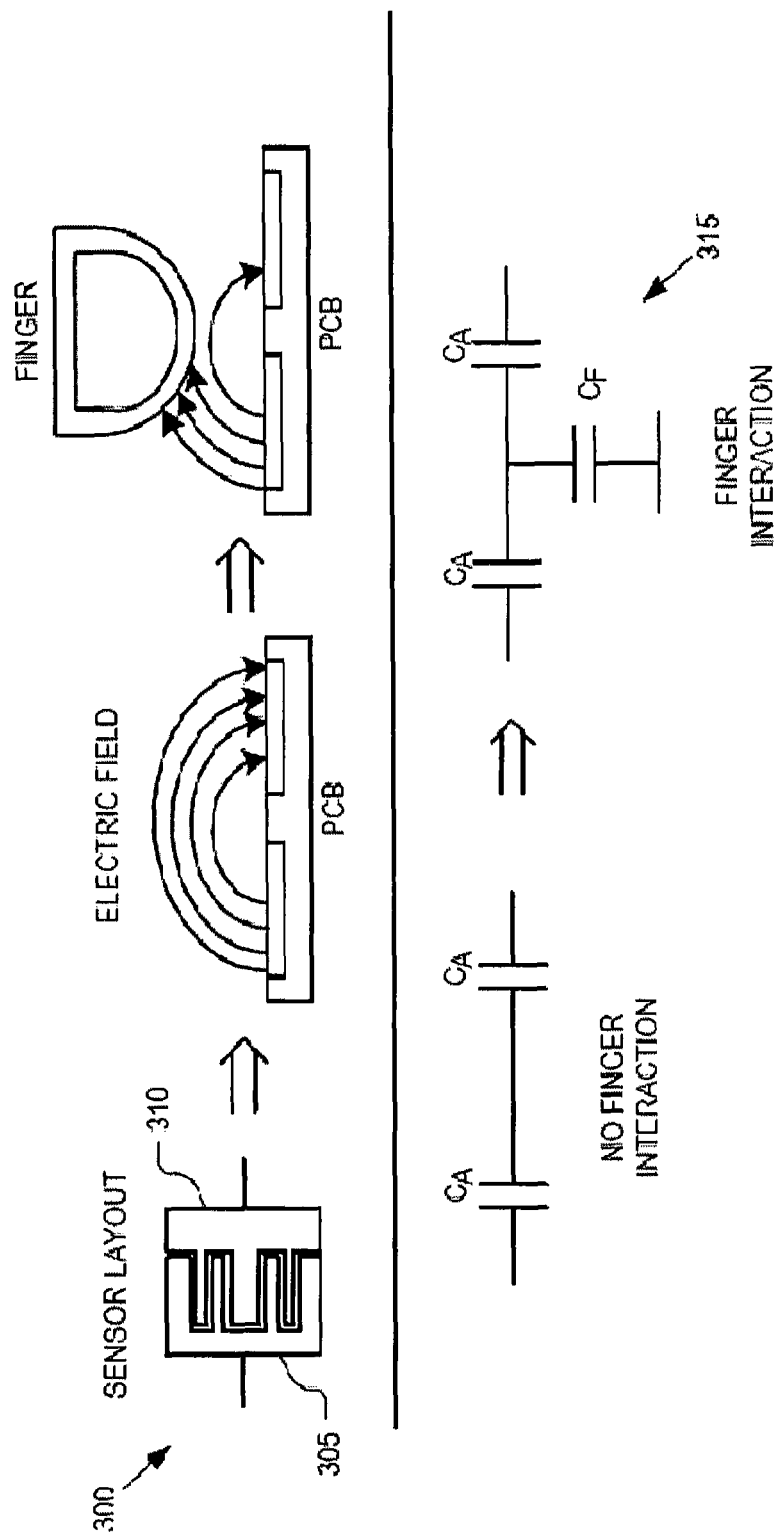
FIG. 3 is a diagram illustrating operation of a capacitive field sensor, in accordance with an embodiment of the invention.

FIG. 3 is a diagram illustrating operation of a capacitive field sensor 300, in accordance with an embodiment of the invention. Capacitive field sensor 300 may be used to implement a user interface of an electronic device. Capacitive field sensor 300 is one possible physical implementation of sense capacitor Cx. The illustrated embodiment of capacitive field sensor 300 is made of two interlocking combs 305 and 310 on a printed circuit board (PCB) substrate. Each comb has a capacitance represented as $C_A$ while the finger has a variable capacitance represented as $C_F$. The sense capacitance Cx represents the capacitance divider circuit 315 formed when the finger is brought into proximity with capacitive field sensor 300.

During a finger touch event, part of electric field is shunted to ground. From simplified equivalent schematic point of view this can be illustrated as adding the finger capacitance $C_F$, which forming the capacitive voltage divider 315. The finger capacitance changes the transmission coefficient of the capacitance divider circuit 315. It is this overall change in capacitance that is sensed by capacitive sensor 200 and converted into a measurement of the duty cycle of a signal FB_SIG output from latch 230 and measured by measurement circuit 215. In one embodiment, logic 217 includes hardware and/or software logic for deciding when a significant change in the duty cycle of FB_SIG should be recognized as a valid finger interaction with capacitive field sensor 300.

FIGS. 4A and 4B illustrate the two non-overlapping phase operation of switching capacitor circuit 205, in accordance with an embodiment of the invention. In one embodiment, during operation of capacitive sensor 200, two configuration phases of switching capacitor circuit 205 are cycled through to perform capacitive sensing. The two phases include: a series charging phase (control signal Phi1 asserted) and a discharge phase (control signal Phi2 asserted).

In one embodiment, control signals Phi1 and Phi2 (see FIG. 2) are generated by control circuit 220 based on a single clock signal CLK. As illustrated in FIG. 4A, Phi1 and Phi2 are generated as non-overlapping pulse signals sufficiently spaced to prevent cross conduction or latch up between SW1, SW2, and SW3. As illustrated in FIG. 4B, during the series charging phase (Phi1='1'; Phi2='0'), Phi1 close circuits SW1 and open circuits SW2 and SW3. This configuration couples sensing capacitor Cx in series with modulation capacitor Cmod. A charging current Icharge flows from the power source Vdd to ground through Cx, D1, and Cmod causing Cx and Cmod to charge. During the charging phase, diode D1 conducts Icharge in a forward biased operating regime.

During the discharging phase (Phi2='1'; Phi1='0'), Phi1 open circuits SW1 and close circuits SW2 and SW3. This configuration disconnects the power source Vdd, while coupling both terminals of sensing capacitor Cx to ground to discharge the sensing capacitor. This configuration also reverse biases diode D1, which prevents Cmod from discharging. Accordingly, the voltage Umod at node N1 is held during the discharging phase. When a finger is moved in proximity to field sensor 300, the variable capacitance of Cx is increased causing less charge to be passed to Cmod during each series charging phase. The greater charge captured by Cx during the charging phase is discharged to ground during the discharge phase. Therefore, the larger Cx, the greater the number of switching cycles of SW1, SW2, and SW3 to charge Cmod to a given voltage.

During operation, the charge on Cmod accumulates via the technique described above until the voltage Umod at node N1 reaches Vref. At this point, the output MOD_SIG from CMP 225 toggles, which is latched and fed back to control switch SW4 as feedback signal FB_SIG. FB_SIG causes switch SW4 to close circuit. Discharge circuit 227 discharges Cmod through Rd until Umod drops below Vref, causing MOD_SIG to toggle once again. Latch 230 introduces a small delay into the feedback path prior to open circuiting SW4. This latch delay is controlled by clock source 235. Once SW4 is open circuited, the switching of SW1, SW2, and SW3 recharges Cmod once again. The voltage Umod continuously dithers back and forth about Vref generating a square wave at the output latch 230. This square wave is analyzed by measurement circuit 215 to determine the duty cycle or percentage of time FB_SIG is high versus low. This percentage averaged over time is representative of the capacitance or capacitance change of sensing capacitor Cx.

Figure 9A:
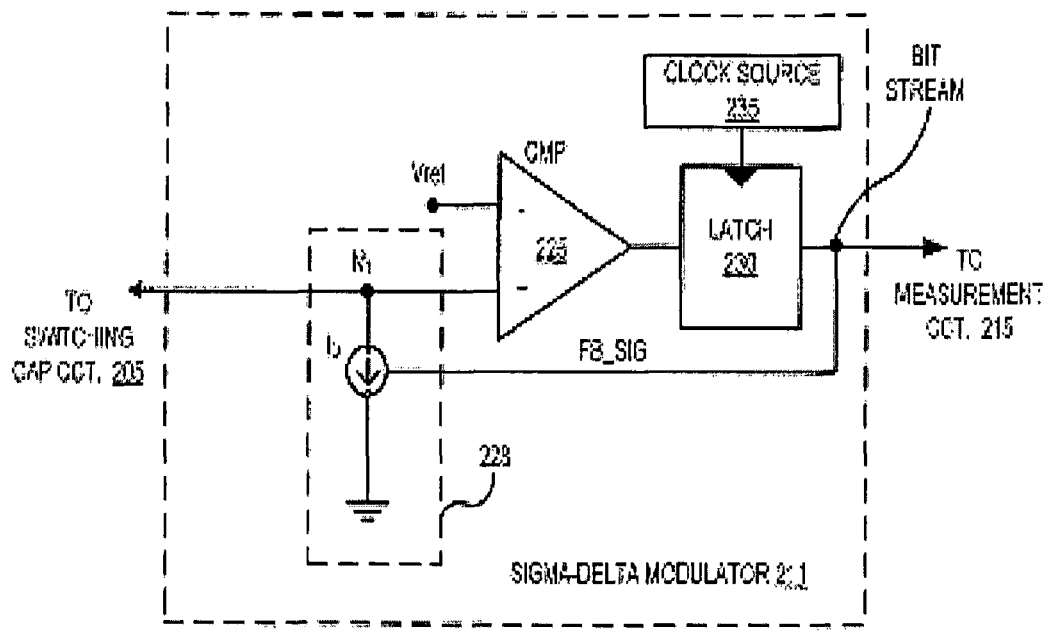
FIGS. 9A-C are circuit diagrams illustrating alternative dissipation circuit implementations within a sigma-delta modulator, in accordance with embodiments of the invention.
Figure 9B:
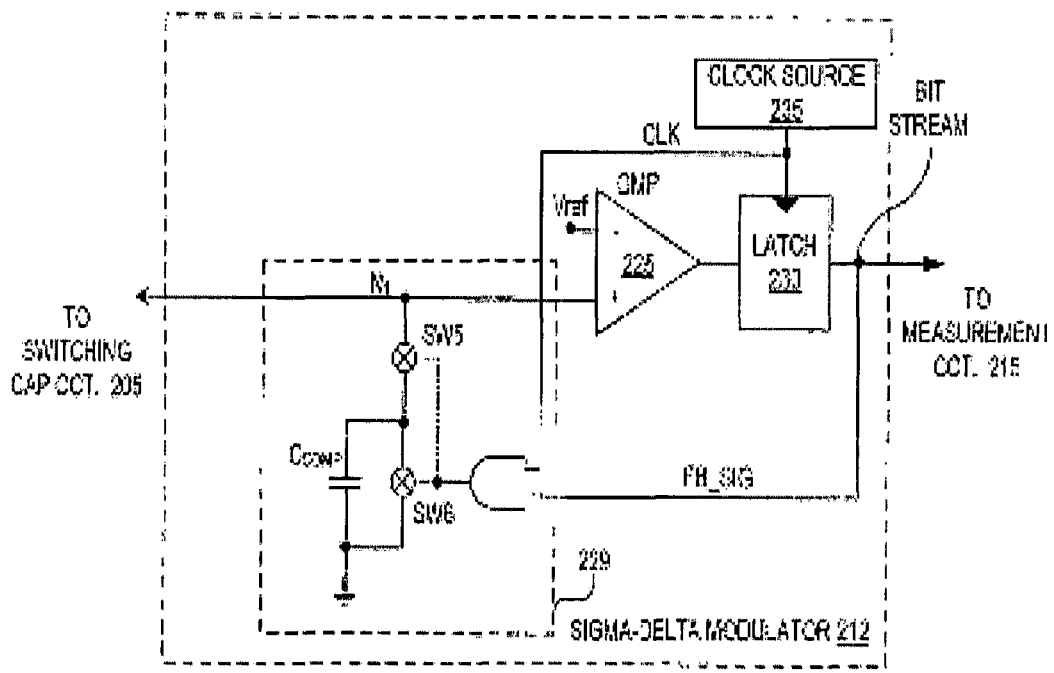
Figure 9C:
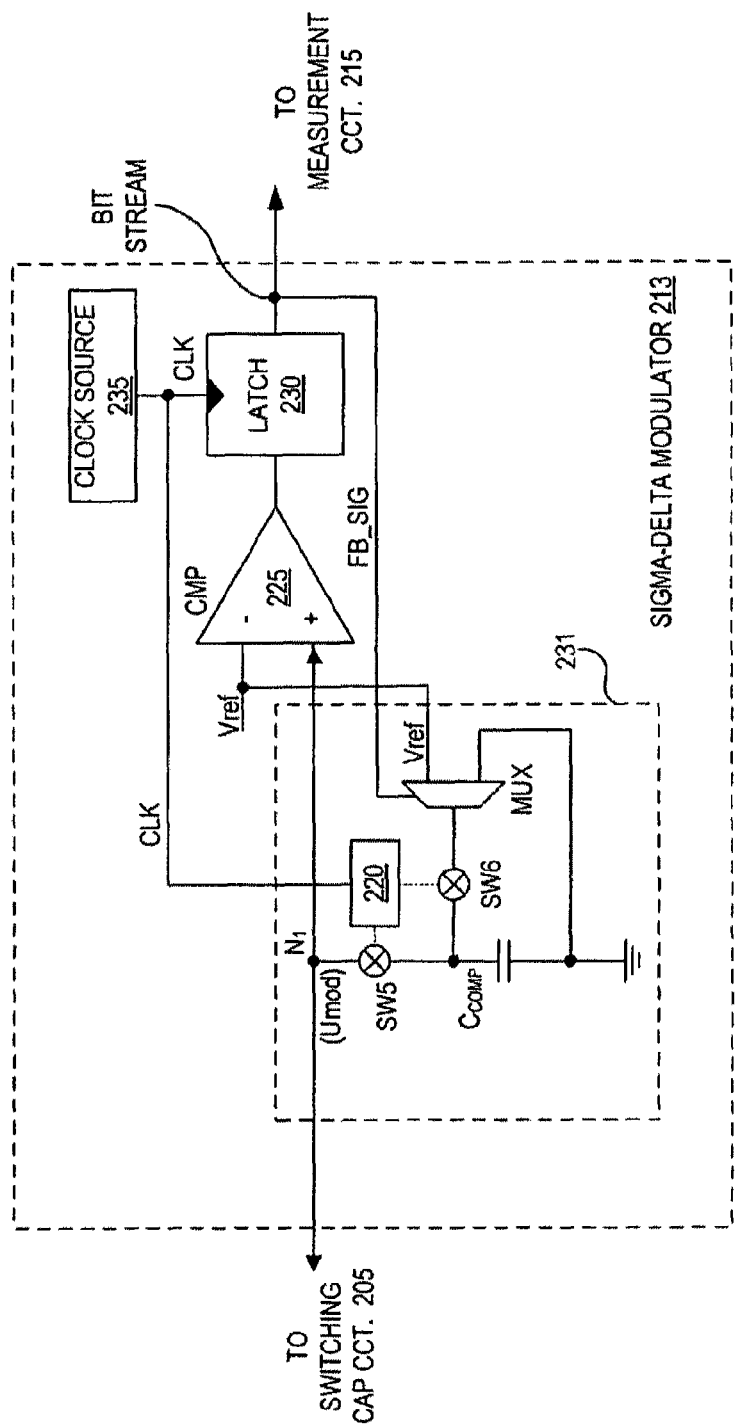

FIGS. 9A-C are circuit diagrams illustrating alternative implementations of charge dissipation circuit 227, in accordance with embodiments of the invention. FIG. 9A illustrates a sigma-delta modulator 211 having a charge dissipation circuit 228, which replaces SW4 and discharge resistor Rd of charge dissipation circuit 227 with a current source $I_D$ controlled by feedback pulse signal FB_SIG. When FB_SIG is a logic HIGH, current source sinks a current $I_D$ from capacitor Cmod to ground. When FB is logic LOW, current source is disabled.

FIG. 9B illustrates sigma-delta modulator 212 having a charge dissipation circuit 229 including a switching capacitor resistor circuit with a gated clock source. When FB_SIG is logic HIGH, the clock signal CLK is applied to the switches SW5 and SW6 with non-overlapping pulses (e.g., such as clock signals Phi1 and Phi2 generated by control circuit 220), causing a discharging current to flow to ground from modulator capacitor Cmod. At a logic LOW value for FB_SIG, the clock signal CLK is gated and switching capacitor circuit Ccomp does not sink current from modulator capacitor Cmod.

FIG. 9C illustrates a sigma-delta modulator 213 having a charge dissipation circuit 231 where the non-overlapping clock phases Phi1 and Phi2 are applied constantly to switches SW5 and SW6, but SW5 and SW6 are selectively connected in series between Umod and either Vref or ground by the multiplexor MUX, depending on the value of the feedback pulse signal FB_SIG. The principle of operating of charge dissipation circuit 231 is similar to charge dissipation circuit 229 in that SW5, SW6, and Ccomp operate as a switching capacitor resistor circuit.

Figure 5:
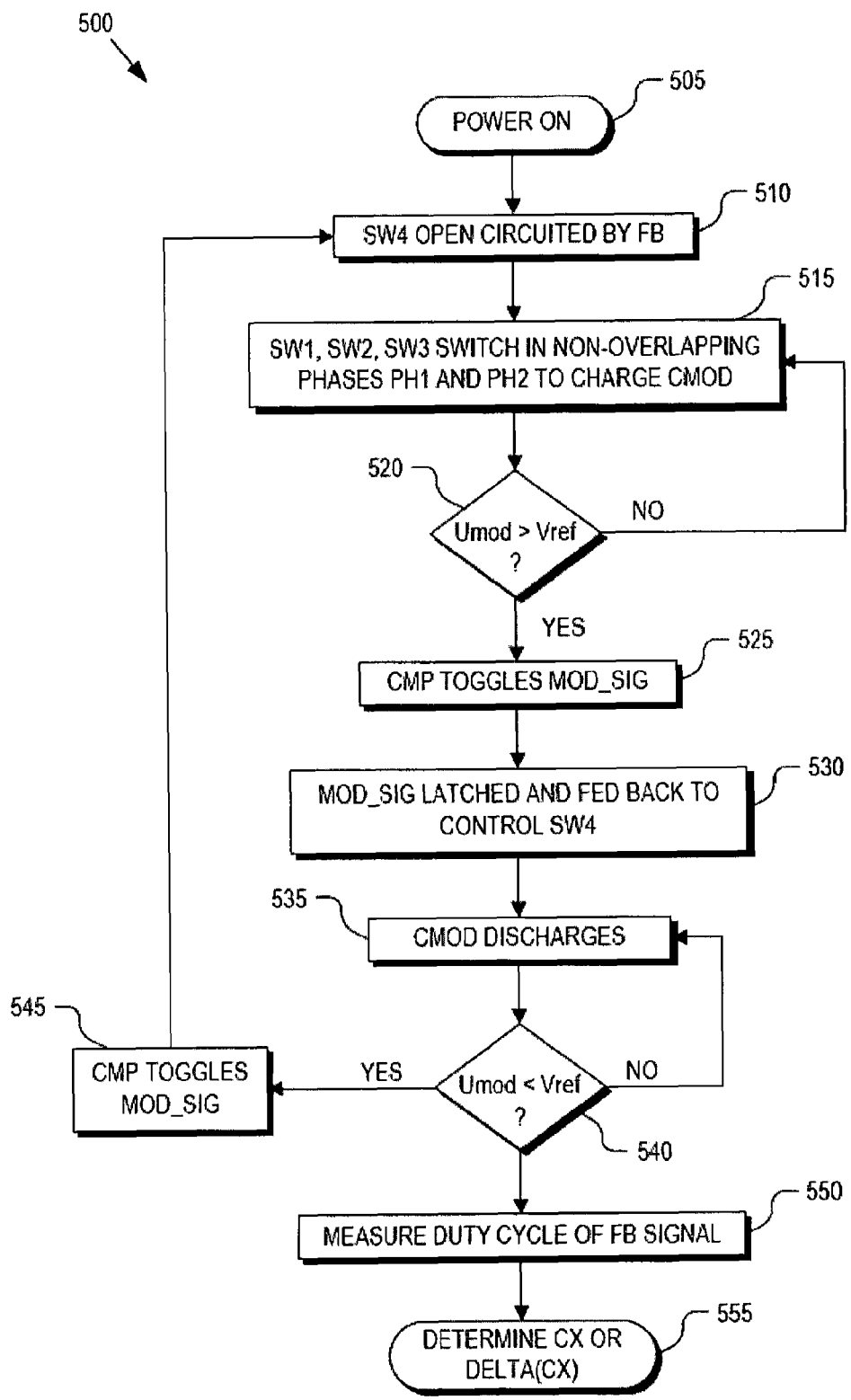
FIG. 5 is a flow chart illustrating operation of a capacitive sensor with a sigma-delta modulator, in accordance with an embodiment of the invention.

FIG. 5 is a flow chart illustrating operation of a capacitive sensor 200 in further detail, in accordance with an embodiment of the invention. The order in which some or all of the process blocks appear in process 500 should not be deemed limiting. Rather, one of ordinary skill in the art having the benefit of the present disclosure will understand that some of the process blocks may be executed in a variety of orders not illustrated, or even in parallel.

In a process block 505, capacitance sensor 200 is powered on and the output of CMP 210 (MOD_SIG) is initially low, assuming Cmod is initially discharged and the voltage Umod is less than Vref. In this state, MOD_SIG is logic "LOW". On the next rising clock edge output from clock source 235, latch 230 latches the value of MOD_SIG to its output. This output is fed back to the control terminal of switch SW4 as feedback signal FB_SIG. A logic LOW open circuits SW4 decoupling node N1 from ground (process block 510) and permitting Cmod to accumulate charge.

With power provided to switching capacitor circuit 205, switches SW1, SW2, and SW3 commence operation (process block 515). Switches SW1, SW2, and SW3 switch under control of a control signals Phi1 and Phi2 generated by control circuit 220, as discussed above. As switching capacitor circuit 205 begins charging Cmod, the voltage potential Umod at node N1 begins to rise gradually. Cmod continues to accumulate charge until Umod reaches Vref, as determined by CMP 225 (decision block 520). When Umod reaches or passes Vref, CMP 225 toggles its output (MOD_SIG) to a logic "HIGH" (process block 525).

In a process block 530, latch 230 latches the value of MOD_SIG to its output as FB_SIG. Latching is synchronized to a clock signal output by clock source 235. FB_SIG is fed back to discharge switch SW4. The toggled value is a logic HIGH, which close circuits discharging switch SW4 and commences discharge of Cmod through Rd (process block 535). Cmod is discharged until Umod drops back below Vref, as determined by CMP 225 (decision block 540), at which point CMP 225 toggles MOD_SIG (process block 545). Discharge switch SW4 is once again open circuited after MOD_SIG is latched and process 500 repeats from process block 510.

After an initial transitory startup phase, capacitance sensor 200 enters its steady state phase where the voltage potential Umod on Cmod oscillates or dithers about Vref. This oscillation about Vref creates the modulation signal MOD_SIG upon which the feedback pulse signal FB_SIG is based. Once operating in the steady state phase, the duty cycle of the FB_SIG is directly proportional to the capacitance or capacitance change of Cx.

Accordingly, in a process block 550, the duty cycle of FB_SIG is measured by measurement circuit 215. In one embodiment, measurement circuit 215 may include a clock gated by FB_SIG and a counter to count a number of clock cycles occurring while FB_SIG is HIGH for a given period of time. Furthermore, there can be other methods to extract the multi-bit digital values from the bit stream data, formed by the sigma-delta modulator, as various types of the digital filters or otherwise. Finally, in a process block 555, the measured duty cycle is used to determine the capacitance Cx or capacitance change ΔCx of the sensing capacitor. Logic 217 may use this digital code to determine whether a user finger has interacted with a capacitive field sensor within a user interface. In one embodiment, measurement circuit 215 may output a digital code indicative of the capacitance or capacitance change of Cx. In one embodiment, capacitive sensor 200 operates as a Cmod charge current (i.e., Icharge in FIG. 4B) to digital code converter. Of course, the charge current of Cmod is related to the variable capacitance of the field sensor Cx.

Figure 6:
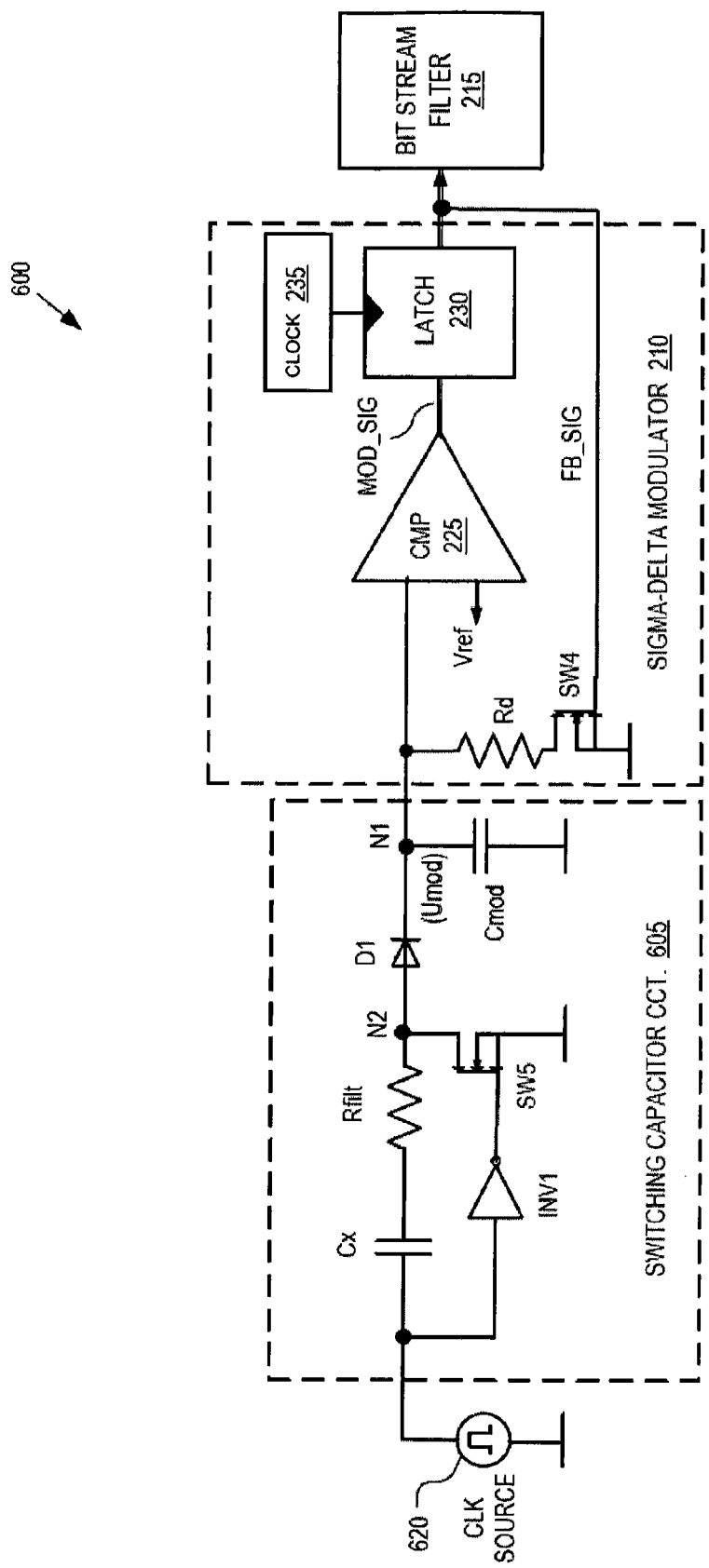
FIG. 6 is circuit diagram of a capacitive sensor with a sigma-delta modulator, in accordance with an embodiment of the invention.

FIG. 6 is a circuit diagram of a capacitive sensor 600 including a sigma-delta modulator, in accordance with an embodiment of the invention. Embodiments of the present invention provide for proximity detection (e.g., up to 1 meter or 40 inches) of objects (e.g., finger) relative to capacitive sensor 600. Capacitive sensor 600 is an alternative embodiment to capacitive sensor 200, but operates using the same principles. The illustrated embodiment of capacitive sensor 600 includes a switching capacitor circuit 605, a sigma-delta modulator 210, measurement circuit 215, and a clock source 620. The illustrated embodiment of switching capacitor circuit 605 includes sensing capacitor Cx, a filter resistor Rfilt, diode D1, modulation capacitor Cmod, a discharge switch SW5, and an inverter INV1. In one embodiment, clock source 620 is a pseudo-random signal (PRS) generator for generating a pseudo-random pulse signal. Other signal generators maybe used, such as a pulse width modulator; however, a PRS generator provides greater electromagnetic noise immunity. Additionally, other frequency spreading techniques can also be used to implement clock source 620, such as frequency sweeping, frequency hopping, changing frequency in the pseudo random order, etc.

Sigma-delta modulator 210 and measurement circuit 215 operate as discussed above in connection with capacitive sensor 200. Similarly, switching capacitor circuit 605 operates to sequentially charge Cmod, just as switching capacitor circuit 205, with a slight variation on its specific implementation. When clock source 620 outputs a logic HIGH, diode D1 is forward biased and switch SW5 is open circuited. The open circuited SW5 connects Cmod in series with Cx and clock source 620. The forward biased D1 permits a charging current to flow through sensing capacitor Cx and filter resistor Rfilt into modulation capacitor Cmod. While clock source 620 is logic HIGH, switching capacitor circuit 605 is in the "charging phase." Capacitive sensor 600 responds asymmetrically to noise and presence of an object (e.g., finger). For example, when a finger is present, there is a decrease in the electric field and a rise in capacitance of Cx which reduces the charge that is added to Cmod. The reduced charge means that Cmod takes longer to charge up to Vref. Sigma-delta modulator 210 measures a current or voltage of the Cmod capacitor and outputs a signal with a duty cycle corresponding to a rate at which the Cmod capacitor is charged. The presence of an object (e.g., finger) proximate to sensing capacitor Cx results in a decrease in the duty cycle. Similarly, the presence of noise on sensing capacitor Cx results in an increase in the duty cycle. The changes in duty cycle (e.g., increase and decrease) may be relative to a stable "non-noise" duty cycle or a baseline duty cycle. The baseline duty cycle may thus correspond to a duty cycle where there is no noise and there is not an object proximate to capacitive sensor 600. The baseline duty cycle may be set during assembly and/or configuration of capacitive sensor 600 or dynamically adjusted as capacitive sensor 600 is used to determine whether an object is proximate to capacitive sensor 600. It is appreciated that changes in duty cycle described herein may be altered (e.g., via use of an inverter) such that an object causes an increase in duty cycle while noise causes a decrease in duty cycle.

Noise can come from a variety of sources including, but not limited to, the environment, cellular telephones, radio stations, and AC noise. In one embodiment, the noise goes to capacitor Cmod as direct current after being rectified by diode D1. That is, the noise flows to capacitor Cmod as extra current. The asymmetric response (e.g., increased signal from noise and a decreased signal from the presence of an object) allows greater noise immunity because the movement of the signal in opposite directions allows for simplified separation of noise and finger signals. It is appreciated that any circuit that measures current or voltage may be used in place of sigma-delta modulator 210 (e.g., Analog to Digital converter (ADC)).

In one embodiment, capacitive sensor 600 is further noise resistant as a result of the high value of capacitor Cmod in combination with the low pass filter of the resistor Rfilt and switch SW5. Rfilt also functions to remove transient effects as CLK source 620 and switch SW5 commutate. Capacitive Sensor 600 is also noise resistant as a portion of the time (e.g., when CLK source 620 is logic LOW) sensor capacitor Cx is coupled to ground on both sides (e.g., via CLK source 620 and SW5) thereby limiting noise impact to capacitive sensor 600 during actual sampling of sensing capacitor Cx.

When clock source 620 transitions to a logic LOW, switch SW5 is closed circuited. The closed circuited SW5 connects node N2 to ground. This couples sensing capacitor Cx to ground through Rfilt and reverse biases diode D1. With Cx coupled to ground it discharges, while the reversed biased diode D1 prevents discharge from modulation capacitor Cmod and Cmod retains its voltage Umod. While clock source 620 is logic LOW, switching capacitor circuit 605 is in the "discharge phase." Each positive cycle of clock source 620 moves some part of the charge of sensing capacitor Cx to capacitor Cmod and voltage on the capacitor Cmod starts rising. For example, an ADC with constant feedback resistor to ground can be used to measure a constant voltage on capacitor Cmod.

During the discharge phase, filter resistor Rfilt and switch SW5 coupled to ground creates a high frequency cutoff low pass filter (LPF). The LPF is formed from Rfilt and switch SW5 to ground parasitic capacitance. This LPF increases noise immunity to high frequencies. The LPF prevents high amplitude, ultra high frequency noise from erroneously flippirig the bias state of diode D1 and causing false triggering. In one embodiment, resistor Rfilt is tuned for optimal performance (e.g., higher resistor values are better for increased noise immunity). It is appreciated that a very high resistance decreases sensitivity of the capacitive sensor. In one embodiment, the optimal resistor value is when amplitude of the shortest PRS pluses is reduced by 10-20%.

Figure 7:
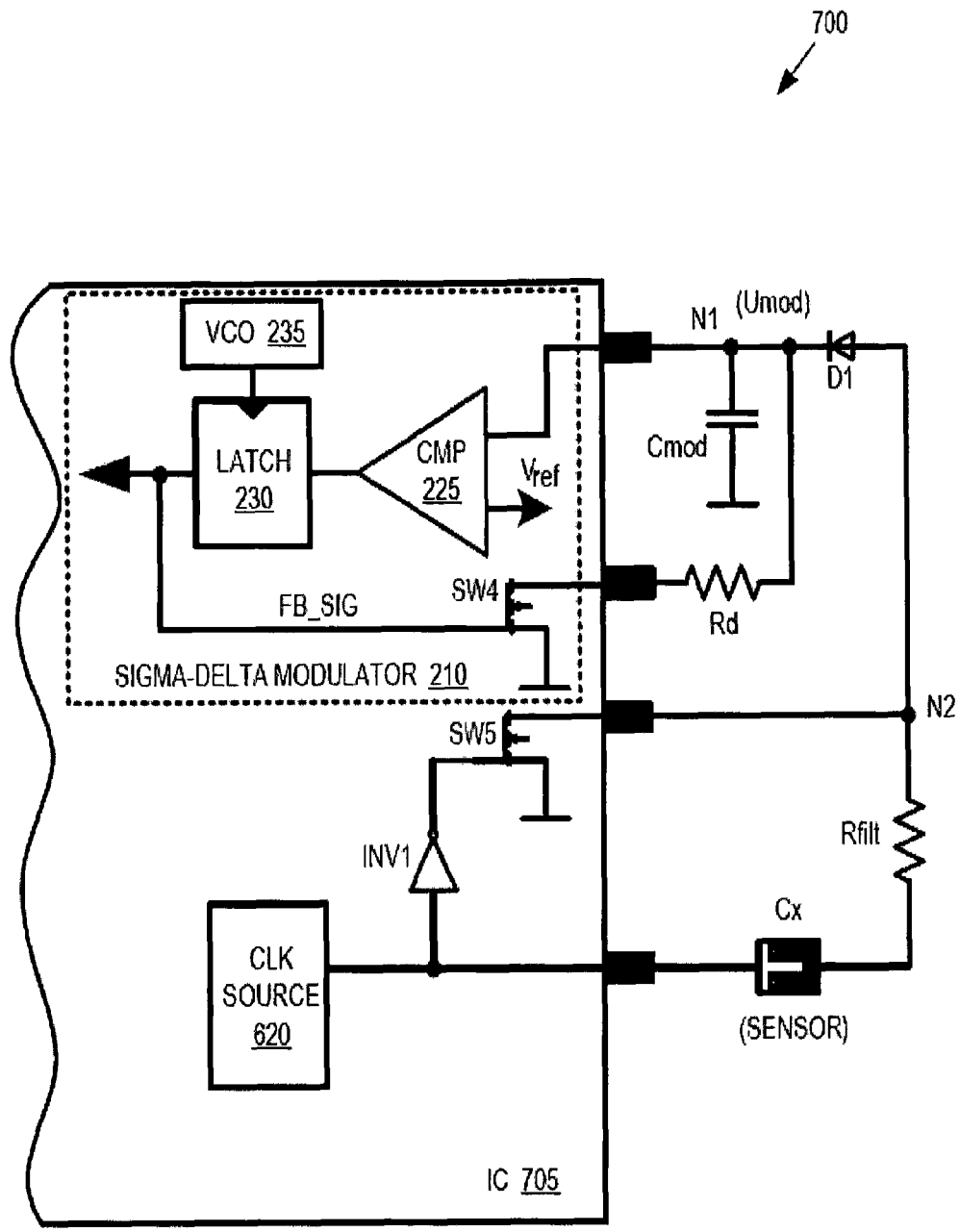
FIG. 7 is a circuit diagram illustrating pin-out connections for implementing a single field sensor interface, in accordance with an embodiment of the invention.

FIG. 7 is a circuit diagram illustrating pin-out connections for implementing a single field sensor interface 700 within an integrated circuit, in accordance with an embodiment of the invention. Integrated circuit ("IC") 705 includes sigma-delta modulator 210, clock source 620, inverter INV1, and switch SW5 integrated on a single die. The following components including: sensing capacitor Cx, filter resistor Rfilt, discharge resistor Rd, modulation capacitor Cmod, and diode D1 are externally coupled to IC 705. In one embodiment, inverter INV1 may be implemented in software or firmware using a look up table ("LUT").

Figure 8:
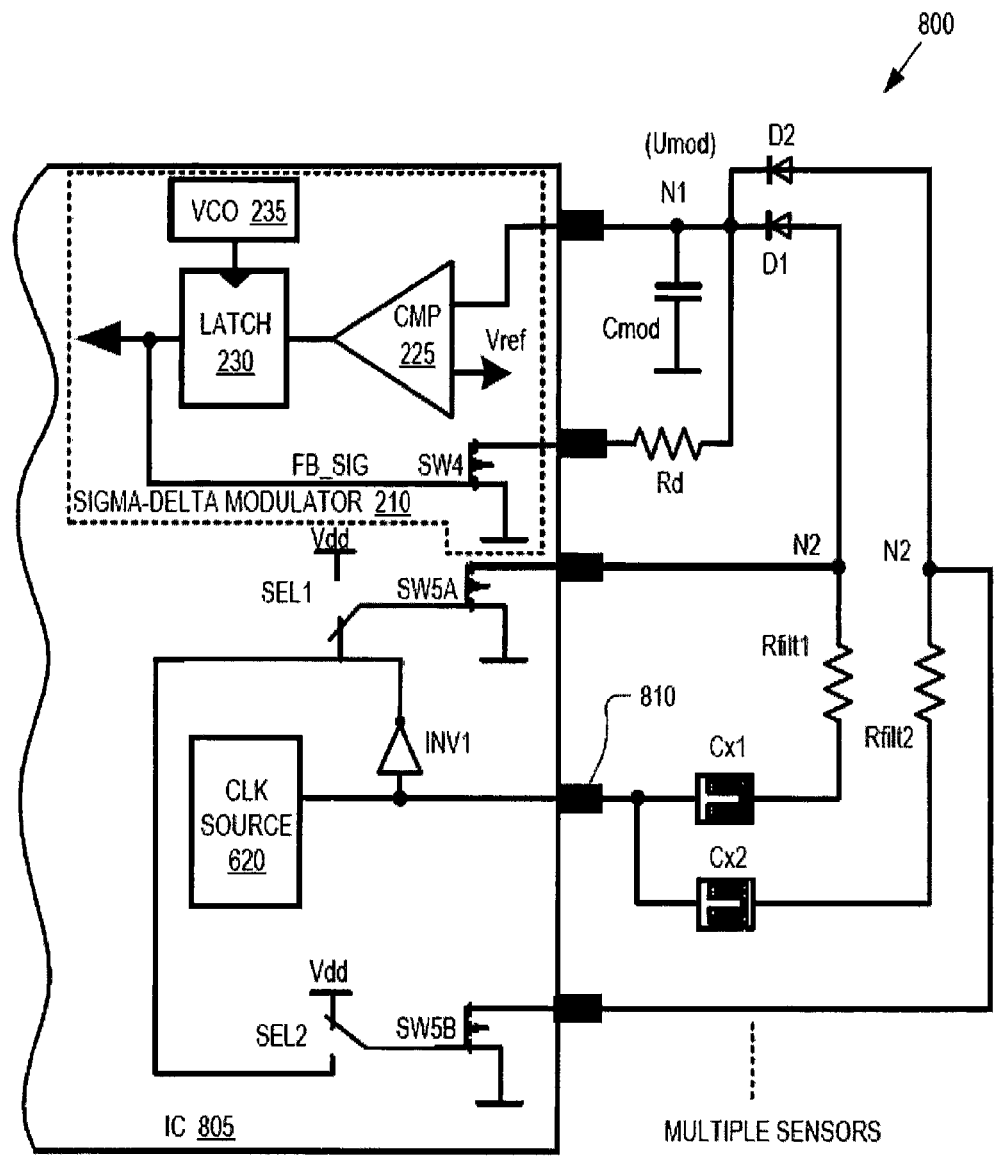
FIG. 8 is a circuit diagram illustrating pin-out connections for implementing a multi-field sensor interface time sharing a single sigma-delta modulator, in accordance with an embodiment of the invention.

FIG. 8 is a circuit diagram illustrating pin-out connections for implementing a multi field sensor interface 800 within an integrated circuit, in accordance with an embodiment of the invention. In one embodiment, IC 805 comprises firmware for selecting which sensor to scan. IC 805 couples multiple field sensors Cx1 and Cx2 to a single general purpose input/output ("GPIO") pin 810. Field sensors Cx1 and Cx2 time share a single GPIO 810, clock source 620, and sigma-delta modulator 210. However, each externally coupled sensor includes its own externally coupled filter resistor (e.g., Rfilt1, Rfilt2) and its own internal switch SW5 (e.g., SW5A, SW5B). Each field sensor Cx1 or Cx2 is scanned one at a time via appropriate switching of the select switches SEL1 and SEL2. Select switches SEL1 and SEL2 either activate the control terminals of switches SW5A and SW5B thereby grounding the corresponding field sensors Cx1 or Cx2, or connect the control terminal to the output of inverter INV1. For example, using SEL1 coupled to INV1 and SEL2 coupled to Vdd and Rfilt2 is coupled to ground allow sensor 1 to be scanned without the influence of sensor 2. Although FIG. 8 illustrates just two field sensors Cx1 and Cx2, it should be appreciated that a large number of field sensors can thus timeshare GPIO pin 810.

Figure 10:
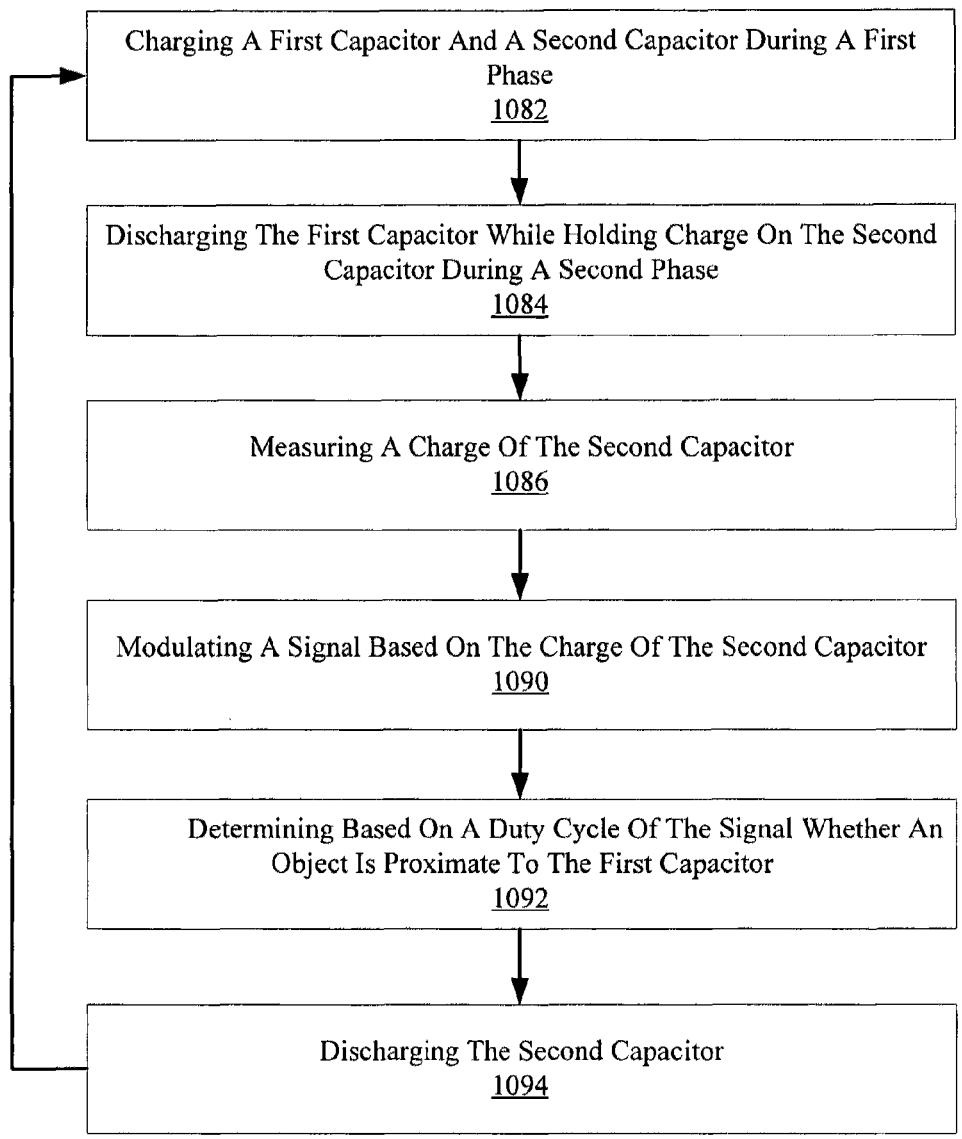
FIG. 10 is a flowchart of a method for determining the presence of an object, in accordance with an embodiment of the invention.

FIG. 10 is a flowchart of a circuit implemented method for determining the presence of an object, in accordance with an embodiment of the invention. In one embodiment, flowchart 1080 is a process for determining whether an object (e.g., finger) is proximate to a sensing capacitor based on an asymmetrical response of a capacitive sensor. It is appreciated that flowchart 1080 may be implemented in hardware, software, or a combination thereof.

In block 1082, a first capacitor (e.g., sensing capacitor Cx) and a second capacitor (e.g., Cx) are charged during a first phase (e.g., CLK source 620 is HIGH).

In block 1084, the first capacitor is discharged while a charge is held on the second capacitor during a second phase (e.g., CLK source 620 is LOW). As described herein, a diode (e.g., diode D1) may be used to hold charge on the second capacitor. The diode further allows the second capacitor to be noise immune during the second phase. In block 1086, a charge of the second capacitor is measured.

In block 1090, a signal is modulated (e.g., by sigma-delta modulator 210) based on the charge of the second capacitor. In block 1092, determination based on a duty cycle of the signal is made as to whether an object is proximate to the first capacitor. As described herein, the duty cycle of the signal is asymmetrically responsive to noise and the presence of an object. The determination may be made based on the duty cycle of the signal decreasing when a finger is proximate to the first capacitor or the duty cycle of the signal increasing in response to noise. In block 1094, the second capacitor is discharged. Block 1082 may then be performed.

Figure 11A:
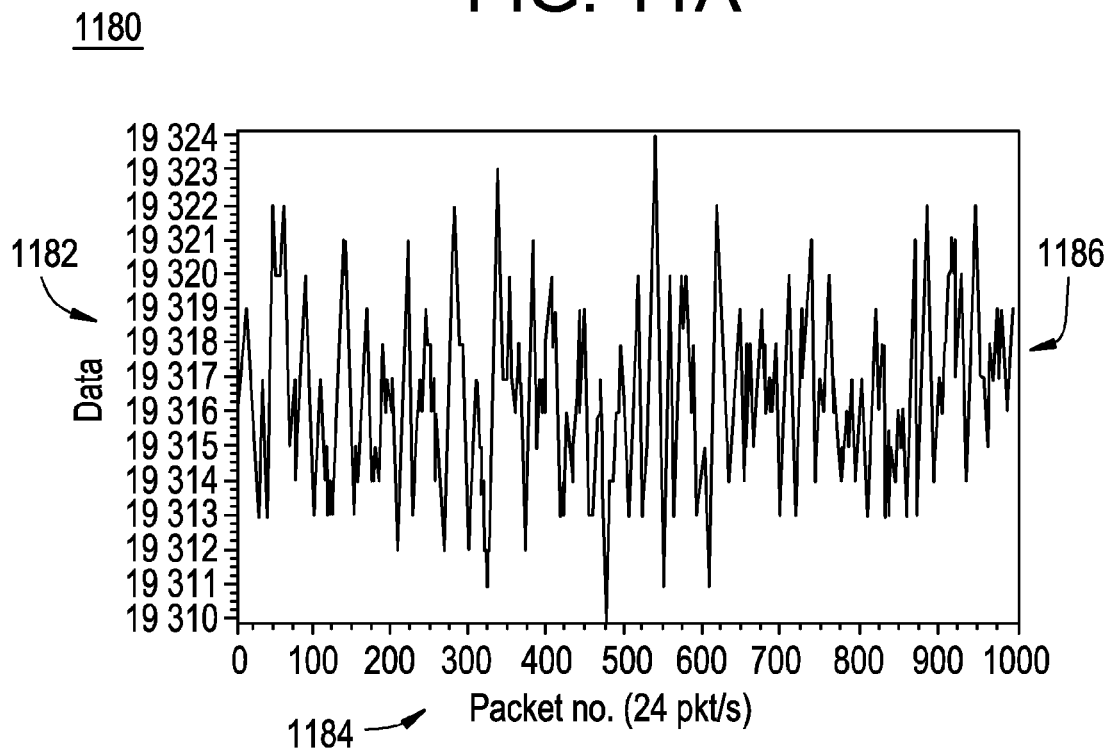
FIGS. 11A-B are graphs of exemplary signals of an exemplary capacitive sensing system, in accordance with an embodiment of the invention.
Figure 11B:
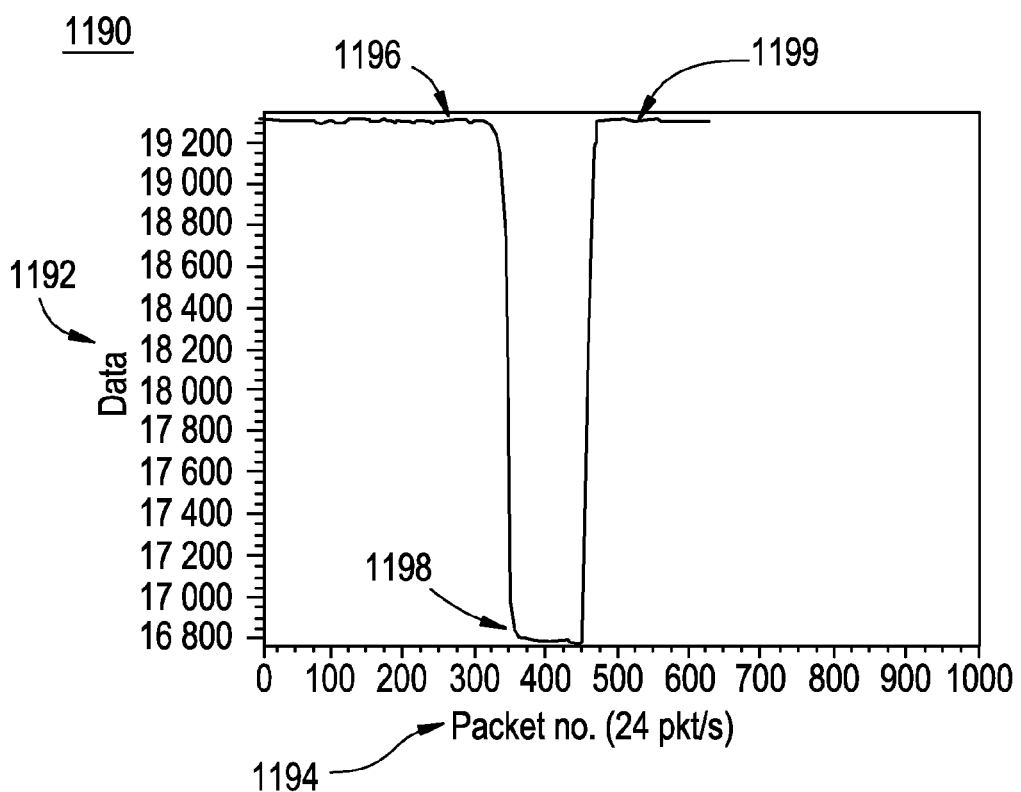

FIGS. 11A-B are graphs of exemplary signals pertinent to an exemplary capacitive sensing system, in accordance with an embodiment of the invention. FIG. 11A includes graph 1180 which illustrates an exemplary signal caused by noise. Graph 1180 includes horizontal axis 1184 representing packet number (e.g., 24 packets/second), vertical axis 1182 representing data, and signal 1186 representing the output caused by noise. It is noted that noise increases the duty cycle (e.g., as denoted by the increase data values).

FIG. 11B includes graph 1190 which illustrates an exemplary signal from a finger in proximity to a sensing capacitor. Graph 1190 includes horizontal axis 1194 representing packet number (e.g., 24 packets/second) and vertical axis 1192 representing data. Portions of the signal 1196 and 1199 correspond to no object (e.g., finger) in proximity of a capacitive sensor. Portion of the signal 1198 corresponds to an object (e.g., finger) being in proximity to the capacitive sensor. The presence of an object increases the capacitance and therefore reduces the duty cycle of the signal from the capacitive sensing system. In one embodiment, such a signal may be from a capacitive sensor with a 2 mm plastic overlay.

FIGS. 12A-B are graphs of exemplary signals of an exemplary capacitive sensing system, in accordance with an embodiment of the invention. FIG. 12A includes graph 1200 which illustrates a signal from a finger and noise. Graph 1200 includes horizontal axis 1204 representing packet number (e.g., 24 packets/second) and vertical axis 1202 representing data. Signal portion 1206 corresponds to a decrease in duty cycle (e.g., 50 kHz) caused by the presence of an object (e.g., finger) in proximity to the capacitive sensor. Signal portion 1208 corresponds to noise and an increase in duty cycle (e.g., 300 kHz). Signal portions 1206 and 1208 reflect the asymmetric responses to noise and finger of embodiments of the present invention. In one embodiment, the asymmetric response allows noise to be filtered out by a software filter updating the baseline. Signal portions 1210 and 1212 correspond to increases in duty cycle as there is no object in proximity to a capacitive sensor.

FIG. 12B includes graph 1250 which illustrates the effect of electrostatic discharge (ESD). Graph 1200 includes horizontal axis 1254 representing packet number (e.g., 24 packets/second) and vertical axis 1252 representing data. Signal portion 1258 corresponds to an increase in duty cycle caused by the ESD. Signal portion 1256 corresponds to the decrease in duty signal caused by the presence of a finger in proximity to the capacitive sensor. It is noted that FIGS. 11A-B and 12A-B illustrate the asymmetrical response to noise and a finger of embodiments of the present invention.

Figure 13:
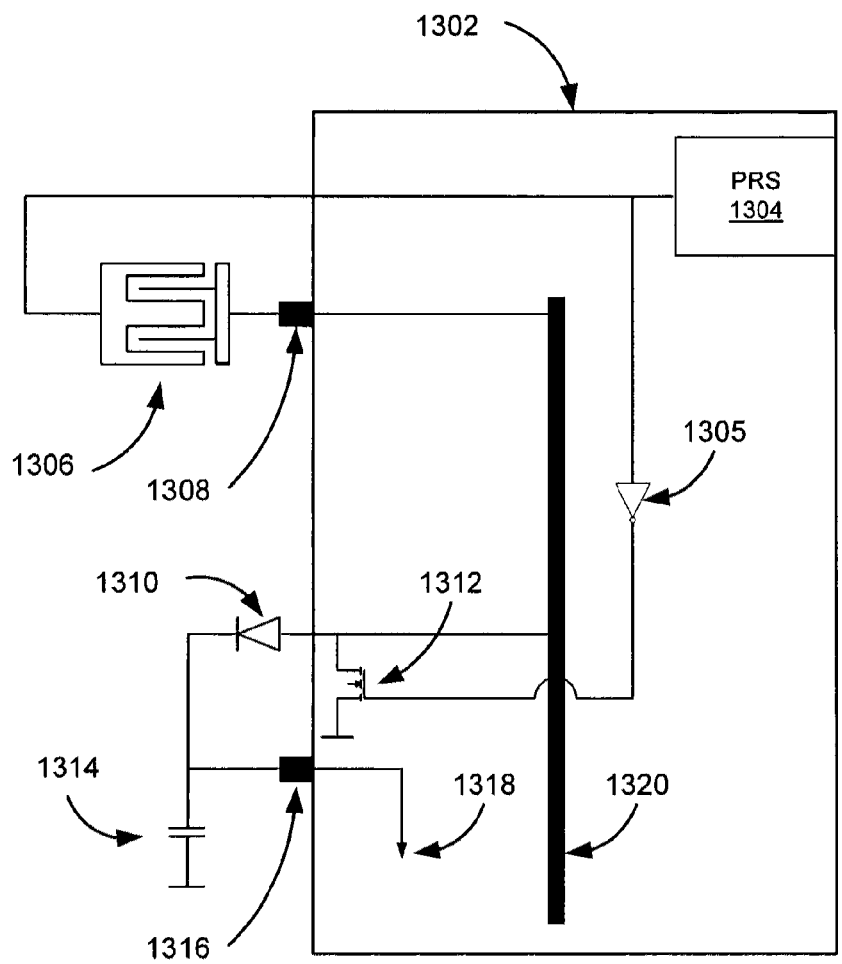
FIG. 13 is a block diagram of an exemplary sensor configuration, in accordance with an embodiment of the invention.

FIG. 13 is a block diagram of an exemplary sensor configuration, in accordance with an embodiment of the invention. Sensor configuration 1300 includes processing device 1302, pseudo-random sequencer 1304, inverter 1305, capacitive sensor 1306, pins 1308, diode 1310, switch 1312, filter capacitive 1314, pin 1316, comparator feed 1318, and analog bus 1320. Sensor configuration 1300 operates in a substantially similar manner as described herein. Sensor configuration 1300 illustrates a connection of the shield electrode to the pins 1308 and 1316 coupled to sensor 1306 and filter capacitor 1314. In one embodiment, switch 1312 is an open drain low switch.

Figure 14:
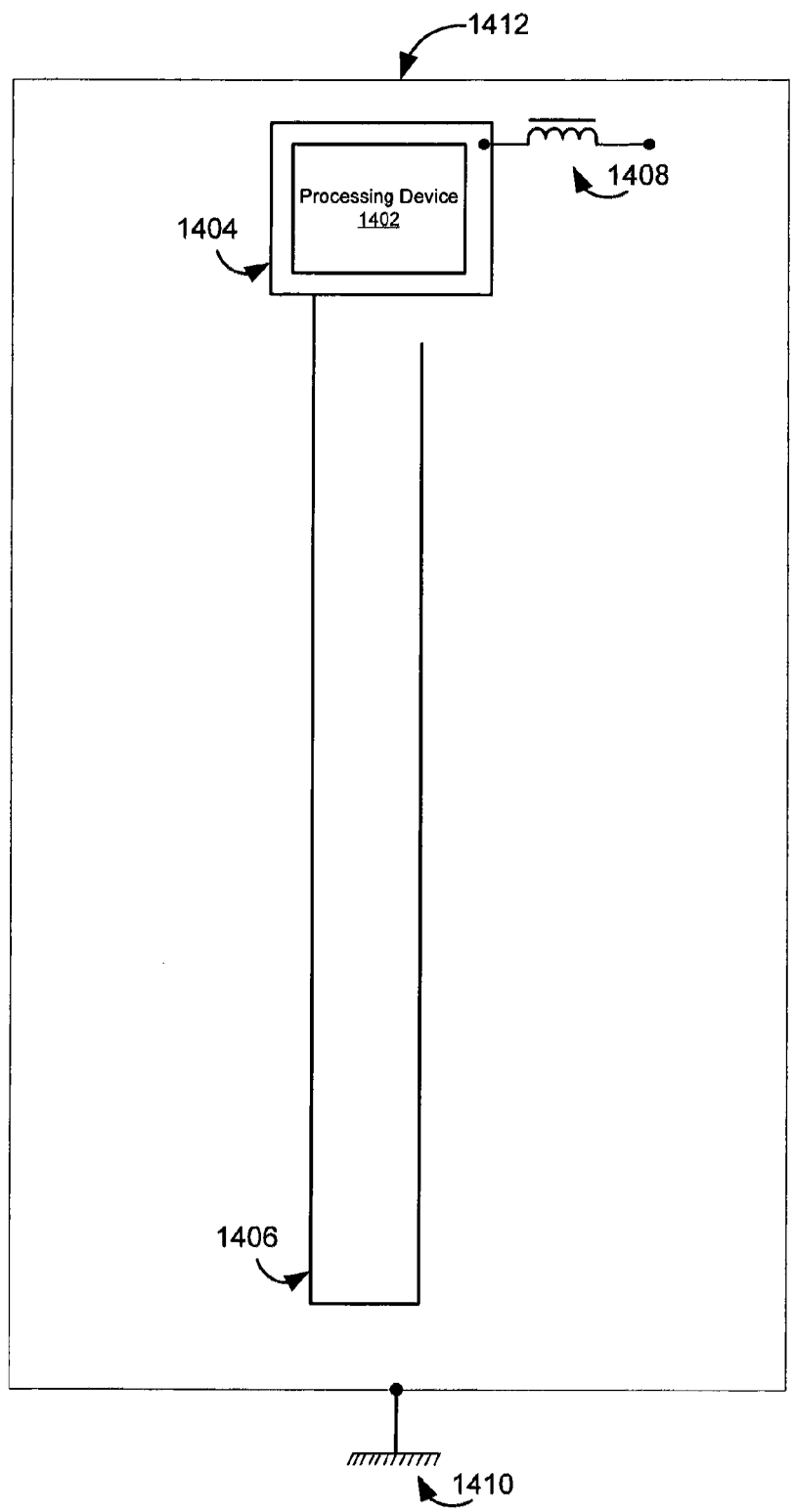
FIG. 14 is a block diagram of an exemplary PCB coupling, in accordance with an embodiment of the invention.

FIG. 14 is a block diagram of an exemplary PCB coupling, in accordance with an embodiment of the invention. Exemplary PCB coupling 1400 includes metal body 1412, processing device 1402, PCB 1404, proximity sensor wires 1406, inductor 1408, and earth ground 1410. Inductor 1408 couples PCB 1404 to metal body 1412 thereby providing higher sensitivity (e.g., 50%) and a galvanic board to metal coupling. This higher sensitivity provides for increased sensitivity proximity sensing. Electromagnetic interference (EMI) radiation can also be decreased.

Figure 15:
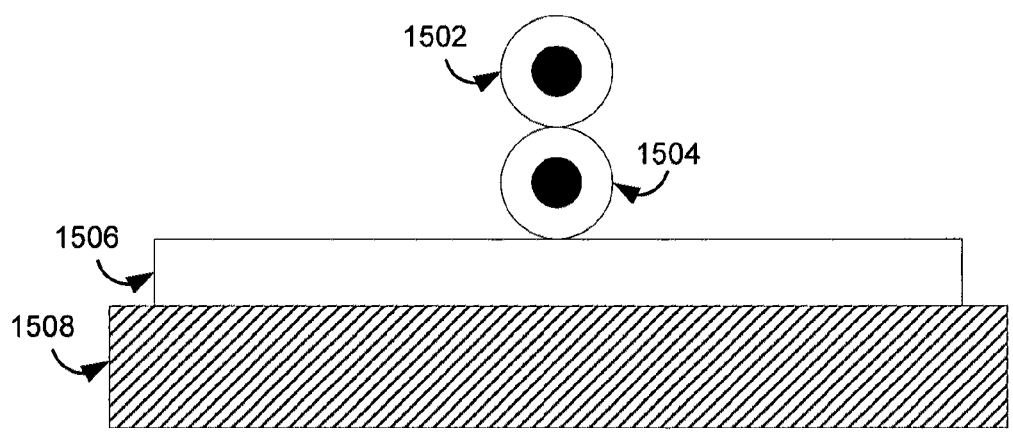
FIG. 15 is a block diagram of an exemplary wire configuration, in accordance with an embodiment of the invention.

FIG. 15 is a block diagram of an exemplary wire configuration, in accordance with an embodiment of the invention. Wire configuration 1500 includes metal body 1508, isolation 1506, transmit wire 1504, and receive wire 1502. Transmit wire 1504 in conjunction with various aspects of embodiments of the present invention may function as a shield electrode thereby removing the need for additional isolation between the wires 1502-1504 and the metal body 1508. It is appreciated that the isolation thickness between a shield electrode and a metal body influences the sensitivity. For example, sensitivity may increase linearly at isolation thickness increases in the range of 1 mm-5 mm. When the thickness exceeds 5 mm, sensitivity dependence on isolation thickness may become very low.

Figure 16:
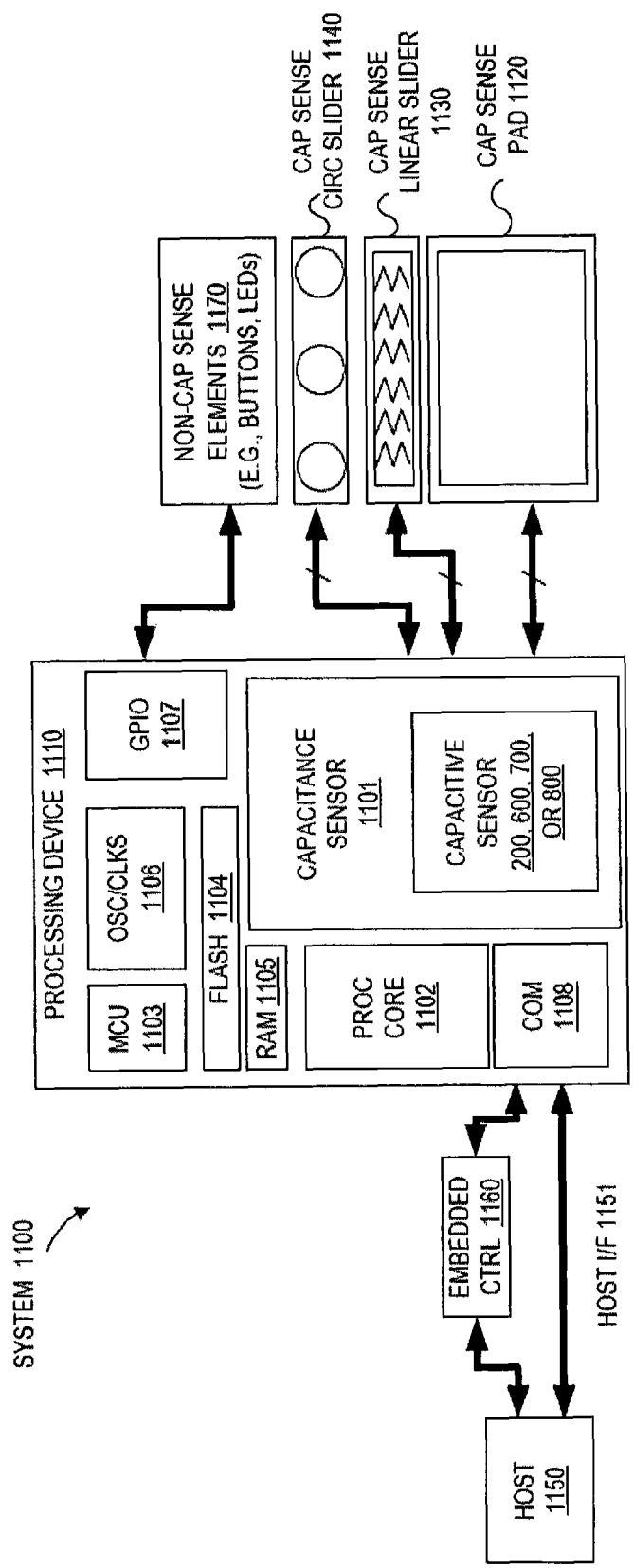
FIG. 16 is a functional block diagram illustrating a demonstrative processing system for implementing a capacitive sense user interface, in accordance with an embodiment of the invention.

FIG. 16 is a functional block diagram illustrating a demonstrative system 1100 for implementing a capacitive sense user interface, in accordance with an embodiment of the invention. The illustrated embodiment of system 1100 includes a processing device 1110, a capacitive sense pad 1120, a capacitive sense linear slider 1130, a capacitive sense radial slider 1140, a host processor 1150, an embedded controller 1160, and non-capacitance sensor elements 1170. Processing device 1110 may include analog and/or digital general purpose input/output ("GPIO") ports 1107. GPIO ports 1107 may be programmable. GPIO ports 1107 may be coupled to a Programmable Interconnect and Logic ("PIL"), which acts as an interconnect between GPIO ports 1107 and a digital block array of processing device 1110 (not illustrated). The digital block array may be configured to implement a variety of digital logic circuits (e.g., DAC, digital filters, digital control systems, etc.) using, in one embodiment, configurable user modules ("UMs"). The digital block array may be coupled to a system bus. Processing device 1110 may also include memory, such as random access memory (RAM) 1105 and program flash 1104. RAM 1105 may be static RAM ("SRAM"), and program flash 1104 may be a non-volatile storage, which may be used to store firmware. Processing device 1110 may also include a memory controller unit ("MCU") 1103 coupled to memory and the processing core 1102.

Processing device 1110 may also include an analog block array (not illustrated). The analog block array is also coupled to the system bus. The analog block array also may be configured to implement a variety of analog circuits (e.g., ADC, analog filters, etc.) using, in one embodiment, configurable UMs. The analog block array may also be coupled to the GPIO 1107.

As illustrated, capacitance sensor 1101, which includes an implementation of capacitance sensor 200, 600, 700, or 800 may be integrated into processing device 1110. Capacitance sensor 1101 may include analog I/O for coupling to an external component, such as capacitive sense pad 1120, capacitive sense linear slider 1130, capacitive sense radial slider 1140, and/or other capacitive sense devices. Capacitive sense pad 1120, capacitive sense linear slider 1130, and/or capacitive sense radial slider 1140 may each include one or more sensing capacitors Cx to implement the individual capacitive sense buttons therein.

Processing device 1110 may include internal oscillator/clocks 1106 and communication block 1108. The oscillator/clocks block 1106 provides clock signals to one or more of the components of processing device 1110. Communication block 1108 may be used to communicate with an external component, such as a host processor 1150, via host interface (I/F) line 1151. Alternatively, processing device 1110 may also be coupled to embedded controller 1160 to communicate with the external components, such as host 1150. Interfacing to the host 1150 can be through various methods. In one exemplary embodiment, interfacing with the host 1150 may be done using a standard PS/2 interface to connect to embedded controller 1160, which in turn sends data to the host 1150 via low pin count (LPC) interface. In some instances, it may be beneficial for processing device 1110 to do both touch-sensor pad and keyboard control operations, thereby freeing up the embedded controller 1160 for other housekeeping functions. In another exemplary embodiment, interfacing may be done using a universal serial bus (USB) interface directly coupled to host 1150 via host interface line 1151. Alternatively, processing device 1110 may communicate to external components, such as host 1150 using industry standard interfaces, such as USB, PS/2, inter-integrated circuit (I2C) bus, or system packet interfaces (SPI). Host 1150 and/or embedded controller 1160 may be coupled to processing device 1110 with a ribbon or flex cable from an assembly, which houses the sensing device and processing device.

In one embodiment, processing device 1110 is configured to communicate with embedded controller 1160 or host 1150 to send and/or receive data. The data may be a command or alternatively a signal. In an exemplary embodiment, system 1100 may operate in both standard-mouse compatible and enhanced modes. The standard-mouse compatible mode utilizes the HID class drivers already built into the Operating System (OS) software of host 1150. These drivers enable processing device 1110 and sensing device to operate as a standard cursor control user interface device, such as a two-button PS/2 mouse. The enhanced mode may enable additional features such as scrolling (reporting absolute position) or disabling the sensing device, such as when a mouse is plugged into the notebook. Alternatively, processing device 1110 may be configured to communicate with embedded controller 1160 or host 1150, using non-OS drivers, such as dedicated touch-sensor pad drivers, or other drivers known by those of ordinary skill in the art.

Processing device 1110 may reside on a common carrier substrate such as, for example, an integrated circuit (IC) die substrate, a multi-chip module substrate, or the like. Alternatively, the components of processing device 1110 may be one or more separate integrated circuits and/or discrete components. In one exemplary embodiment, processing device 1110 may be a Programmable System on a Chip (PSoC™) processing device, manufactured by Cypress Semiconductor Corporation, San Jose, Calif. Alternatively, processing device 1110 may be one or more other processing devices known by those of ordinary skill in the art, such as a microprocessor or central processing unit, a controller, special-purpose processor, digital signal processor ("DSP"), an application specific integrated circuit ("ASIC"), a field programmable gate array ("FPGA"), or the like. In an alternative embodiment, for example, processing device 1110 may be a network processor having multiple processors including a core unit and multiple microengines. Additionally, processing device 1110 may include any combination of general-purpose processing device(s) and special-purpose processing device(s).

Capacitance sensor 1101 may be integrated into the IC of processing device 1110, or alternatively, in a separate IC. Descriptions of capacitance sensor 1101 may be generated and compiled for incorporation into other integrated circuits. For example, behavioral level code describing capacitance sensor 1101, or portions thereof, may be generated using a hardware descriptive language, such as VHDL or Verilog, and stored to a machine-accessible medium (e.g., CD-ROM, hard disk, floppy disk, etc.). Furthermore, the behavioral level code can be compiled into register transfer level ("RTL") code, a netlist, or even a circuit layout and stored to a machine-accessible medium. The behavioral level code, the RTL code, the netlist, and the circuit layout all represent various levels of abstraction to describe capacitance sensor 1101.

In one embodiment, electronic system 1100 may be used in a notebook computer. Alternatively, system 1100 may be used in other applications, such as a mobile handset, a personal data assistant (PDA), a keyboard, a television, a remote control, a monitor, a handheld multi-media device, a handheld video player, a handheld gaming device, or a control panel.

The processes explained above are described in terms of computer software and hardware. The techniques described may constitute machine-executable instructions embodied within a machine (e.g., computer) readable medium, that when executed by a machine will cause the machine to perform the operations described. Additionally, the processes may be embodied within hardware, such as an application specific integrated circuit ("ASIC") or the like.

A machine-accessible medium includes any mechanism that provides (e.g., stores) information in a form accessible by a machine (e.g., a computer, network device, personal digital assistant, manufacturing tool, any device with a set of one or more processors, etc.). For example, a machine-accessible medium includes recordable/non-recordable media (e.g., read only memory (ROM), random access memory (RAM), magnetic disk storage media, optical storage media, flash memory devices, etc.).

The above description of illustrated embodiments of the invention, including what is described in the Abstract, is not intended to be exhaustive or to limit the invention to the precise forms disclosed. While specific embodiments of, and examples for, the invention are described herein for illustrative purposes, various modifications are possible within the scope of the invention, as those skilled in the relevant art will recognize.

These modifications can be made to the invention in light of the above detailed description. The terms used in the following claims should not be construed to limit the invention to the specific embodiments disclosed in the specification. Rather, the scope of the invention is to be determined entirely by the following claims, which are to be construed in accordance with established doctrines of claim interpretation.

What is claimed is:

1. A method for determining a presence of an object, the method comprising:
   charging a first capacitor and a second capacitor during a first phase;
   discharging said first capacitor during a second phase;
   measuring a charge of said second capacitor;
   modulating a signal based on said charge of said second capacitor;

determining based on a duty cycle of said signal whether an object is proximate to said first capacitor, wherein said duty cycle of said signal is asymmetrically responsive to noise and a presence of an object.

2. The method of claim 1, wherein said duty cycle of said signal decreases relative to baseline duty cycle when a finger is proximate to said first capacitor.

3. The method of claim 1, wherein said duty cycle of said signal increases relative to a baseline duty in response to noise.

4. The method of claim 1, wherein a diode is used to block discharge from said second capacitor.

5. The method of claim 4, wherein said diode functions to provide noise immunity to said second capacitor, during said second phase.

6. A capacitive sensor circuit, comprising:
a modulation capacitor coupled with a sensing capacitor;
a plurality of switches configured to charge the sensing capacitor and the modulation capacitor during a first phase, and discharge the sensing capacitor during a second phase;
a modulator circuit coupled with the modulation capacitor and configured to modulate a signal based on an amount of charge stored on the modulation capacitor;
a measurement circuit coupled with the modulator circuit, wherein the measurement circuit is configured to determine based on a duty cycle of said signal whether an object is proximate to said sensing capacitor, wherein said duty cycle of said signal is asymmetrically responsive to noise and a presence of the object, wherein during the second phase, wherein the plurality of switches are configured to couple the sensing capacitor to ground.

7. The capacitive sensor circuit of claim 6, wherein the measurement circuit is configured to determine that the object is within a threshold proximity to the sensing capacitor when the duty cycle decreases relative to a baseline duty cycle.

8. The capacitive sensor circuit of claim 6, wherein the modulator circuit is further configured to increase the duty cycle of the signal in response to noise.

9. The capacitive sensor circuit of claim 8, wherein the modulator circuit comprises a comparator configured to generate an output based on comparing a voltage of the modulation capacitor with a reference voltage.

10. The capacitive sensor circuit of claim 6, further comprising a diode configured to block discharge from the modulation capacitor.

11. The capacitive sensor circuit of claim 10, wherein the diode is configured to provide noise immunity to the modulation capacitor during the second phase.

12. The capacitive sensor circuit of claim 10, wherein during the first phase, the plurality of switches is configured to couple the sensor capacitor to the modulation capacitor and to the diode.

13. A capacitive sensor circuit, comprising:
a modulation capacitor coupled with a sensing capacitor;
a plurality of switches configured to charge the modulation capacitor based on a capacitance of the sensing capacitor;
a modulation circuit coupled with the modulation capacitor and configured to generate a modulated signal having a duty cycle that changes in a first direction in response to a change in capacitance of the sensing capacitor and changes in a second direction in response to noise.

14. The capacitive sensor of claim 13, wherein the plurality of switches is further configured to:
charge the sensing capacitor and the modulation capacitor during a first phase, and
discharge the sensing capacitor during a second phase.

15. The capacitive sensor of claim 13, further comprising a diode coupled between the sensing capacitor and the modulation capacitor, wherein the diode is configured to rectify a current resulting from the noise.

16. The capacitive sensor of claim 13, further comprising a diode coupled between the sensing capacitor and the modulation capacitor, wherein the diode is configured to block discharge from the modulation capacitor.

17. The capacitive sensor of claim 13, wherein the plurality of switches is configured to charge the sensing capacitor and the modulation capacitor during the first phase by connecting the sensing capacitor and the modulation capacitor to a voltage source.

18. The capacitive sensor of claim 13, wherein the modulation circuit is configured to decrease the duty cycle relative to a baseline duty cycle when the capacitance of the sensing capacitor is increased by an object proximate to the sensing capacitor.

19. The capacitive sensor of claim 13, wherein the modulator circuit is further configured to increase the duty cycle of the signal in response to noise.

20. The capacitive sensor of claim 13, wherein the modulator circuit comprises a comparator configured to generate an output based on comparing a voltage of the modulation capacitor with a reference voltage.

* * * * *